(12) United States Patent
Gopalraja et al.

(10) Patent No.: US 6,991,709 B2
(45) Date of Patent: *Jan. 31, 2006

(54) MULTI-STEP MAGNETRON SPUTTERING PROCESS

(75) Inventors: Praburam Gopalraja, Sunnyvale, CA (US); Jianming Fu, San Jose, CA (US); Fusen Chen, Saratoga, CA (US); Girish Dixit, San Jose, CA (US); Zheng Xu, Foster City, CA (US); Wei Wang, Santa Clara, CA (US); Ashok K. Sinha, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/934,231

(22) Filed: Sep. 3, 2004

(65) Prior Publication Data

US 2005/0056536 A1     Mar. 17, 2005

Related U.S. Application Data

(60) Division of application No. 10/197,680, filed on Jul. 16, 2002, now Pat. No. 6,787,006, which is a division of application No. 09/703,601, filed on Nov. 1, 2000, now Pat. No. 6,451,177, which is a continuation-in-part of application No. 09/518,180, filed on Mar. 2, 2000, now Pat. No. 6,277,249, which is a continuation-in-part of application No. 09/490,026, filed on Jan. 21, 2000, now Pat. No. 6,251,242.

(51) Int. Cl.
*C23C 14/34* (2006.01)

(52) U.S. Cl. .............................. 204/192.3; 204/192.15; 204/192.22

(58) Field of Classification Search ........... 204/192.12, 204/192.15, 192.22, 192.23; 427/576
See application file for complete search history.

(56) References Cited

U.S. PATENT DOCUMENTS

| 5,985,762 | A | 11/1999 | Geffken et al. ............. 438/687 |
| 6,042,700 | A | 3/2000 | Gopalraja et al. ........ 204/192.5 |
| 6,642,146 | B1 | 11/2003 | Rozbicki et al. ............ 438/687 |
| 6,787,006 | B2 * | 9/2004 | Gopalraja et al. ........ 204/192.3 |

* cited by examiner

*Primary Examiner*—Steven VerSteeg
(74) *Attorney, Agent, or Firm*—Charles S. Guenzer

(57) ABSTRACT

A multi-step sputtering process in plasma sputter reactor having target and magnetron operable in two modes, for example, in a substrate sputter etch and a substrate sputter deposition. The target has an annular vault facing the wafer to be sputter coated. Various types of magnetic means positioned around the vault create a magnetic field supporting a plasma extending over a large volume of the vault. An integrated copper via filling process with the inventive reactor or other reactor includes a first step of highly ionized sputter deposition of copper, which can optionally be used to remove the barrier layer at the bottom of the via, a second step of more neutral, lower-energy sputter deposition of copper to complete the seed layer, and a third step of electroplating copper into the hole to complete the metallization. The first two steps can be also used with barrier metals.

24 Claims, 15 Drawing Sheets

MULTI-STEP MAGNETRON SPUTTERING PROCESS

RELATED APPLICATIONS

This application is a division of Ser. No. 10/197,680, filed Jul. 16, 2002, to be issued on Sep. 7, 2004 as U.S. Pat. No. 6,787,006, which is a division of Ser. No. 09/703,601, filed Nov. 1, 2000, now issued as U.S. Pat. No. 6,451,177, which is a continuation in part of Ser. No. 09/518,180, filed Mar. 2, 2000, now issued as U.S. Pat. No. 6,277,249, which is a continuation in part of Ser. No. 09/490,026, filed Jan. 21, 2000, now issued as U.S. Pat. No. 6,251,242. The application is also related to Ser. No. 09/703,738, filed Nov. 11, 2000, now issued as U.S. Pat. No. 6,406,599.

FIELD OF THE INVENTION

The invention relates generally to plasma sputtering. In particular, the invention relates to the sputter target and associated magnetron used in a sputter reactor and to an integrated via filling process using sputtering.

BACKGROUND ART

A semiconductor integrated circuit contains many layers of different materials usually classified according to whether the layer is a semiconductor, a dielectric (electrical insulator) or metal. However, some materials such as barrier materials, for example, TiN, are not so easily classified. The two principal current means of depositing metals and barrier materials are sputtering, also referred to as physical vapor deposition (PVD), and chemical vapor deposition (CVD). Of the two, sputtering has the inherent advantages of low cost source material and high deposition rates. However, sputtering has an inherent disadvantage when a material needs to be filled into a deep narrow hole, that is, one having a high aspect ratio. The same disadvantage obtains when a thin layer of the material needs to be coated onto the sides of the hole, which is often required for barrier materials. Aspect ratios of 3:1 present challenges, 5:1 becomes difficult, 8:1 is becoming a requirement, and 10:1 and greater are expected in the future. Sputtering itself is fundamentally a nearly isotropic process producing ballistic sputter particles which do not easily reach the bottom of deep narrow holes. On the other hand, CVD tends to be a conformal process equally effective at the bottom of holes and on exposed top planar surfaces.

Up until the recent past, aluminum has been the metal of choice for the metallization used in horizontal interconnects and in the vias connecting two levels of metallization. In more recent technology, copper vias extend between two levels of horizontal copper interconnects. Contacts to the underlying silicon present a larger problem, but may still be accomplished with either aluminum or copper. Copper interconnects are used to reduce signal delay in advanced ULSI circuits. It is understood that copper may be pure copper or a copper alloy containing up to 10% alloying with other elements such as magnesium and aluminum. Due to continued downward scaling of the critical dimensions of microcircuits, critical electrical parameters of integrated circuits, such as contact and via resistances, have become more difficult to achieve. In addition, due to the smaller dimensions, the aspect ratios of inter-metal features such as contacts and vias are also increasing. An advantage of copper is that it may be quickly and inexpensively deposited by electrochemical processes, such as electroplating. However, sputtering or possibly CVD of thin copper layers onto the walls of via holes is still considered necessary to act as an electrode for electroplating or as a seed layer for the electroplated copper. The discussion of copper processes will be delayed until later.

The conventional sputter reactor has a planar target in parallel opposition to the wafer being sputter deposited. A negative DC voltage is applied to the target of magnitude sufficient to ionize the argon working gas into a plasma. The positive argon ions are attracted to the negatively charged target with sufficient energy to sputter atoms of the target material. Some of the sputtered atoms strike the wafer and form a sputter coating thereon. Most usually, a magnetron is positioned in back of the target to create a larger magnetic field adjacent to the target. The magnetic field traps electrons, and, to maintain charge neutrality in the plasma, the ion density also increases. As a result, the plasma density and sputter rate are increased. The conventional magnetron generates a magnetic field lying principally parallel to the target.

Much effort has been expended to allow sputtering to effectively coat metals and barrier materials deep into narrow holes. High-density plasma (HDP) sputtering has been developed in which the argon working gas is excited into a high-density plasma, which is defined as a plasma having an ionization density of at least $10^{11}$ cm$^{-3}$ across the entire space the plasma fills except the plasma sheath. Typically, an HDP sputter reactor uses an RF power source connected to an inductive coil adjacent to the plasma region to generate the high-density plasma. The high argon ion density causes a significant fraction of sputtered atoms to be ionized. If the pedestal electrode supporting the wafer being sputter coated is negatively electrically biased, the ionized sputter particles (metal ions) are accelerated toward the wafer to form a directional column that reaches deeply into narrow holes.

HDP sputter reactors, however, have disadvantages. They involve a somewhat new technology and are relatively expensive. Furthermore, the quality of the sputtered films they produce is often not the best, typically having an undulatory surface. Also, high-energy ions, particularly the argon ions which are also attracted to the wafer, tend to damage the material already deposited.

Another sputtering technology, referred to as self-ionized plasma (SIP) sputtering, has been developed to fill deep holes. See, for example, U.S. patent application Ser. No. 09/373,097 filed Aug. 12, 1999 by Fu, now issued as U.S. Pat. No. 6,183,614, and U.S. patent application Ser. No. 09/414,614 filed Oct. 8, 1999 by Chiang et al, now issued as U.S. Pat. No. 6,398,929. Both of these patent applications are incorporated by reference in their entireties. In its original implementations, SIP relies upon a somewhat standard capacitively coupled plasma sputter reactor having a planar target in parallel opposition to the wafer being sputter coated and a magnetron positioned in back of the target to increase the plasma density and hence the sputtering rate. The SIP technology, however, is characterized by a high target power density, a small magnetron, and a magnetron having an outer magnetic pole piece enclosing an inner magnetic pole piece with the outer pole piece having a significantly higher total magnetic flux than the inner pole piece. In some implementations, the target is separated from the wafer by a large distance to effect long-throw sputtering, which enhances collimated sputtering. The asymmetric magnetic pole pieces causes the magnetic field to have a significant vertical component extending far towards the wafer, thus enhancing and extending the high-density plasma volume and promoting transport of ionized sputter particles.

The SIP technology was originally developed for sustained self-sputtering (SSS) in which a sufficiently high number of sputter particles are ionized that they may be used to further sputter the target and no argon working gas is required. Of the metals commonly used in semiconductor fabrication, only copper has a sufficiently high self-sputtering yield to allow sustained self-sputtering.

The extremely low pressures and relatively high ionization fractions associated with SSS are advantageous for filling deep holes with copper. However, it was quickly realized that the SIP technology could be advantageously applied to the sputtering of aluminum and other metals and even to copper sputtering at moderate pressures. SIP sputtering produces high quality films exhibiting high hole filling factors regardless of the material being sputtered.

Nonetheless, SIP has some disadvantages. The small area of the magnetron may require circumferential scanning of the magnetron in a rotary motion at the back of the target to achieve even a minimal level of uniformity, and even with rotary scanning, radial uniformity is difficult to achieve. Furthermore, very high target powers have been required in the previously known versions of SIP. High-capacity power supplies are expensive and necessitate complicated target cooling. Lastly, known versions of SIP tend to produce a relatively low ionization fraction of sputter particles, for example, 20%. The remaining non-ionized fraction of sputtered particles has a relatively isotropic distribution rather than forming a forward directed column which results from metal ions being accelerated toward a biased wafer. Also, the target diameter in a typical commercial sputter reactor is only slightly greater than the wafer diameter. As a result, those holes being coated located at the edge of the wafer have radially outer sidewalls which see a larger fraction of the target and are more heavily coated than the radially inner sidewalls. Therefore, the sidewalls of the edge holes are asymmetrically coated.

Other sputter geometries have been developed which increase the ionization density. One example is a multi-pole hollow cathode target, several variants of which are disclosed by Barnes et al. in U.S. Pat. No. 5,178,739. Its target has a hollow cylindrical shape, usually closed with a circular back wall, and is electrically biased. Typically, a series of magnets, positioned on the sides of the cylindrical cathode of alternating magnetic polarization, create a magnetic field extending generally parallel to the cylindrical sidewall.

Another approach uses a pair of facing targets facing the lateral sides of the plasma space above the wafer. Such systems are described, for example, by Kitamoto et al. in "Compact sputtering apparatus for depositing Co—Cr alloy thin films in magnetic disks," *Proceedings: The Fourth International Symposium on Sputtering & Plasma Processes*, Kanazawa, Japan, Jun. 4–6, 1997, pp. 519–522, by Yamazato et al. in "Preparation of TiN thin films by facing targets magnetron sputtering, ibid., pp. 635–638, and by Musil et al. in "Unbalanced magnetrons and new sputtering systems with enhanced plasma ionization," *Journal of Vacuum Science and Technology A*, vol. 9, no. 3, May 1991, pp. 1171–1177. The facing pair geometry has the disadvantage that the magnets are stationary and create a horizontally extending field that is inherently non-uniform with respect to the wafer.

Musil et al., ibid., pp. 1174, 1175 describe a coil-driven magnetic mirror magnetron having a central post of one magnetic polarization and surrounding rim of another polarization. An annular vault-shaped target is placed between the post and rim. This structure has the disadvantage that the soft magnetic material forming the two poles, particularly the central spindle, are exposed to the plasma during sputtering and inevitably contaminate the sputtered layer. Furthermore, the coil drive provides a substantially cylindrical geometry, which may not be desired in some situations. Also, the disclosure illustrates a relatively shallow geometry for the target vault, which does not take advantage of some possible beneficial effects for a concavely shaped target.

Helmer et al. in U.S. Pat. No. 5,482,611 describe a target having a groove or vault facing the substrate. Stationary magnets are arranged on the outside of the vault sidewalls with parallel magnetic polarities so as to create a magnetic field generally parallel to the vault walls within the vault and having a magnetic cusp or null spot near the opening of the vault. The magnetic cusp directs the metal sputter ions in a beam towards the wafer. However, Helmer et al. admit that uniformity of deposition with this magnetic configuration is not good. Lantsman in U.S. Pat. No. 5,589,041 discloses an plasma etch chamber having a dielectric roof that is formed with a vault so as to shape the plasma.

It is thus desired to combine many of the good benefits of the different plasma sputter reactors described above while avoiding their separate disadvantages.

Returning now to copper processing and the structures that need to be formed for copper vias, as is well known to those in the art, in a typical copper interconnect process flow, a thin barrier layer is first deposited onto the walls of the via hole prior to the copper deposition. The barrier layer prevents copper from diffusing into the insulating dielectric layer separating the two copper levels and also to prevent intra metal and inter metal electrical shorts. A typical barrier for copper over silicon oxide includes Ta or TaN or a combination thereof, but other materials have been proposed, such as W/WN and Ti/TiN among others. In a typical barrier deposition process, the barrier layer is deposited using PVD or other method to form a continuous layer between the underlying and overlying copper layers including the contact area at the bottom of the via hole. Thin layers of these barrier materials have a small but finite transverse resistance. A structure resulting from this copper interconnect process produces a contact having a finite characteristic resistance (known in the art as a contact or via resistance) that depends on the geometry. Conventionally, the barrier layer at the bottom of the contact or via hole contributes about 30% of the total contact or via resistance. Geffken et al. disclose in U.S. Pat. No. 5,985,762 a separate directional etching step to remove the barrier layer from the bottom of the via hole over an underlying copper feature but not from the via sidewalls so that, during the sputter removal of the copper oxide at the via bottom, the dielectric is not poisoned by the sputtered copper. This process requires presumably a separate etching chamber. Furthermore, the process deleteriously also removes the barrier at the bottom of the trench in a dual-damascene structure. They accordingly deposit another conformal barrier layer, which remains under the metallized via.

As a result, there is a need in the art for a method and apparatus to form a low-resistance contact between underlying and overlying copper layers and having a low contact resistance without unduly complicating the process.

A copper layer used to form an interconnect is conveniently deposited by electrochemical deposition, for example, electroplating. As is well known, an adhesion or seed layer of copper is usually required to nucleate an ensuing electrochemical deposition on the dielectric sidewalls as well as to provide a current path for the electroplating. In a typical deposition process, the copper seed layer is deposited using PVD or CVD methods, and the seed layer is typically deposited on top of the barrier layer. A typical barrier/seed layer deposition sequence also requires a pre-clean step to remove native oxide and other contaminants that reside on the underlying metal that has been previously exposed in etching the via hole. The pre-clean step, for example, a sputter etch clean step using an argon plasma, is typically performed in a process chamber that is separate from the PVD chamber used to deposit the barrier and seed layers. With shrinking dimension of the integrated circuits, the efficacy of the pre-clean step, as well as sidewall coverage of the seed layer within the contact/via feature, become more problematical.

As a result, the art needs a method and apparatus that improves the pre-clean and deposition of the seed layer. Further, the seed layer needs to be conformally deposited in all portions of the via hole even if the barrier layer is removed in portions of the hole.

SUMMARY OF THE INVENTION

The invention includes a magnetron producing a large volume or thickness of a plasma, preferably a high-density plasma. The long travel path through the plasma volume allows a large fraction of the sputtered atoms to be ionized so that their energy and directionality can be controlled by substrate biasing.

In one embodiment of the invention, the target includes at least one annular vault on the front side of the target. The backside of the target includes a central well enclosed by the vault and accommodating an inner magnetic pole of one polarity. The backside of the target also includes an outer annular space surrounding the vault and accommodating an outer magnetic pole of a second polarity. The outer magnetic pole may be annular or be a circular segment which is rotated about the inner magnetic pole.

In one embodiment, the magnetization of the two poles may be accomplished with soft pole pieces projecting into the central well and the outer annular space and magnetically coupled to magnets disposed generally behind the well and outer annular space. In a second embodiment, the two poles may be radially directed magnetic directions. In a third embodiment, a magnetic coil drives a yoke having a spindle and rim shape.

In one advantageous aspect of the invention, the target covers both the spindle and the rim of the yoke as well as forming the vault, thereby eliminating any yoke sputtering.

According to another aspect of the invention, the relative amount of sputtering of the top wall of the inverted vault relative to the sidewalls may be controlled by increasing the magnetic flux in the area of the top wall. An increase of magnetic flux at the sidewalls may result in a predominantly radial distribution of magnetic field between the two sidewalls, resulting in large sputtering of the sidewalls.

One approach for increasing the sputtering of the top wall places additional magnets above the top wall with magnetic polarities aligned with the magnets just outside of the vault sidewalls. Another approach uses only the top wall magnets to the exclusion of the sidewall magnets. In this approach, the back of the target can be planar with no indentations for the central well or the exterior of the vault sidewalls. In yet another approach, vertical magnets are positioned near the bottom of the vault sidewalls with vertical magnetic polarities opposed to those the corresponding magnets near the top of the vault sidewalls, thereby creating semi-toroidal fields near the bottom sidewalls. Such fields can be adjusted either for sputtering or for primarily extending the top wall plasma toward the bottom of the vault and repelling its electrons from the sidewalls. A yet further approach scans over a top wall a small, closed magnetron having a central magnetic pole of one polarity and a surrounding magnetic pole of the other polarity.

The target may be formed with more than one annular vault on the side facing the substrate. Each vault should have a width of at least 2.5 cm, preferably at least 5 cm, and more preferably at least 7 cm. The width is thus at least 10 times and preferably at least 25 times the dark space, thereby allowing the plasma sheath to conform to the vault outline.

Various magnetron configurations are possible for use with the vaulted target. A particularly advantageous design includes an annular inner sidewall magnet of one polarity, an outer sidewall magnet of the other polarity, and a roof magnet that rotates about the central axis. The roof magnet may be composed of an annular outer magnet of the second polarity surrounding an inner magnet of the first polarity. The inner sidewall magnet is preferably divided into two axial portions separated by a non-magnetic spacer, thereby smoothing the erosion pattern on the inner target sidewall because the magnetic field is curved towards the non-magnetic; however, although the non-magnetic spacer is not required for all aspects of the invention.

The invention also includes a two-step sputtering process, the first producing high-energy ionized copper sputter ions, the second producing a more neutral, lower-energy sputter flux. The two-step process can be combined with an integrated copper fill process in which the first step provides high sidewall coverage and may break through the bottom barrier layer and clean the copper. The second step completes the seed layer. Thereafter, copper is electrochemically deposited in the hole. For sputtering into a dual-damascene structure, the conditions are preferably set so that the first step sputters the barrier from the bottom of the via hole but not from the more accessible trench floor.

After forming a first level of metal on a wafer and pattern etching a single or dual damascene structure for a second level of metal on the wafer, the wafer is processed in a PVD cluster tool to deposit a barrier layer and a seed layer for the second metal level.

Instead of using a pre-clean step (for example, a sputter etch clean step), in accordance with one aspect of the present invention, a simultaneous clean-deposition step (i.e., a self-clean deposition step) is carried out. The inventive self clean deposition is carried out using a PVD deposition chamber that is capable of producing high-energy ionized target material. In accordance with one embodiment of the present invention, the high-energy ions physically remove material on flat areas of a wafer. In addition, the high-energy ions can dislodge material from a barrier layer disposed at the bottom of a contact/via feature. Further, in accordance with one embodiment of the present invention, wherein an initial thickness of the barrier layer is small, the high-energy ions can remove enough material from the barrier layer to provide direct contact between a seed layer and the underlying metal (for example, between a copper underlying layer and a copper seed layer). In addition to providing direct contact between the two copper layers, the inventive sputtering process also causes redeposition of copper over sidewalls of the contact/via to reinforce the thickness of the copper seed layer on the sidewall. This provides an improved path for current conduction, and advantageously improves the conformality of a layer subsequently deposited by electroplating.

DETAILED DESCRIPTION OF THE PREFERRED EMBODIMENTS

The invention uses a complexly shaped sputter target and a specially shaped magnetron which have the combined effect of impressing a magnetic field producing a thick region of relatively high plasma density. As a result, a large fraction of the metal atoms sputtered from the target can be ionized as they pass through the plasma region. Sputtered metal ions can be advantageously controlled by substrate biasing to coat the walls of a deep, narrow hole and to selectively interact with the already deposited barrier layer dependent upon the local geometry.

The inventive apparatus has been used to achieve several novel processes involving selective removal of layers at the bottom of high aspect-ratio holes and the selective sputter deposition on areas dependent upon their geometries. Multi-step processes involving both removal and deposition can be performed in the same sputter reactor, for example, the inventive reactor with a novel target and associated magnetron.

Apparatus

Figure 1:
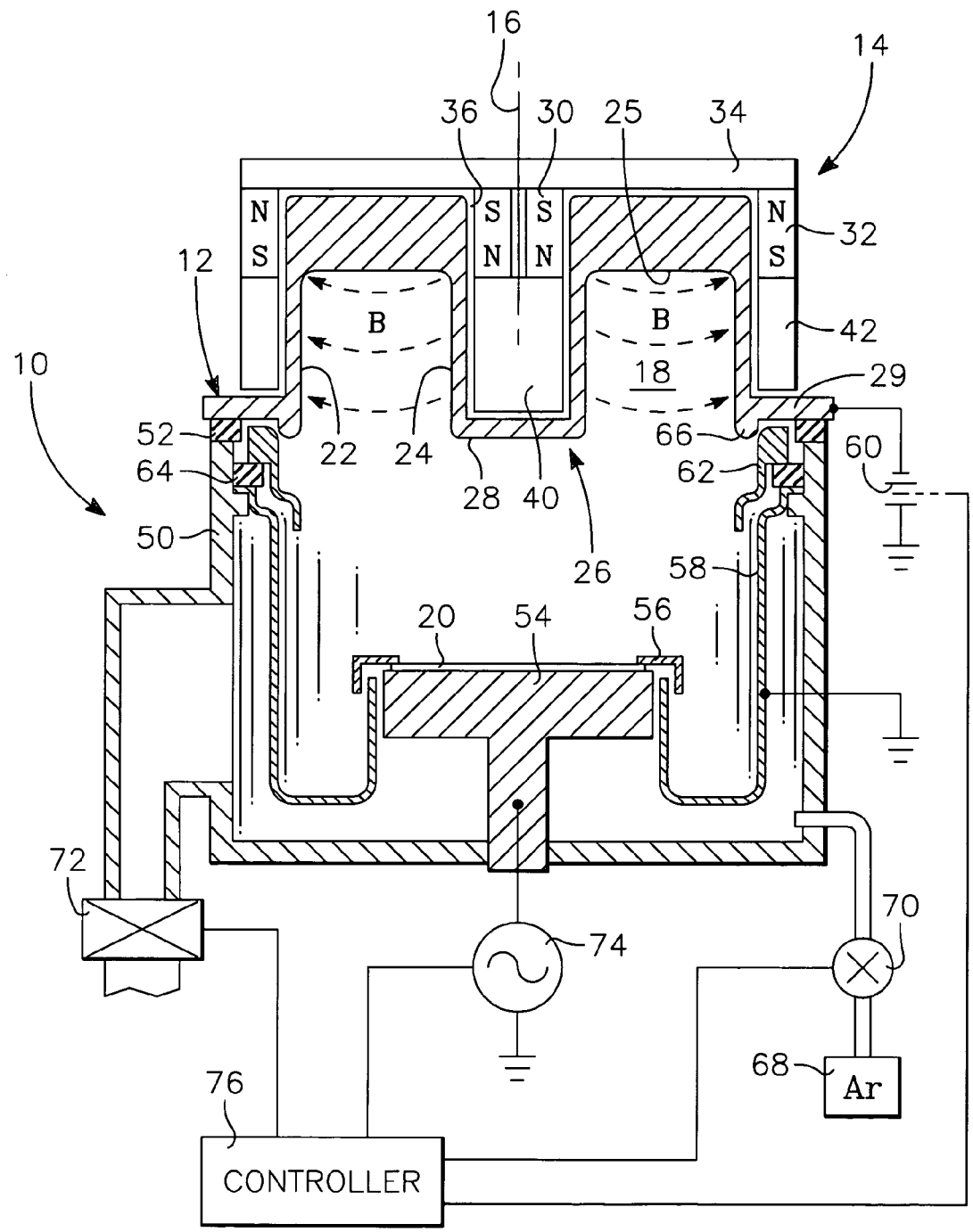
FIG. 1 is a schematic cross-sectional view of a first embodiment of a magnetron sputter reactor of the invention using a stationary, circularly symmetric magnetron.

A magnetron sputter reactor 10 of a first embodiment of the invention is illustrated in the schematic cross-sectional view of FIG. 1. It includes a specially shaped sputter target 12 and magnetron 14 symmetrically arranged about a central axis 16 in a reactor otherwise described for the most part by Chiang et al. in the above referenced patent application. This reactor and associated processes will be referred to as SIP+ sputtering in contrast to the SIP sputter reactor of Chiang et al., which uses a planar target. The shaped target 12 or at least its interior surface is composed of the material to be sputter deposited. The invention is particularly useful for sputtering copper, but it may be applied to other sputtering materials as well. It is understood that target may be composed of alloys, typically to less than 10% of alloying. For example, copper is often alloyed with silicon, aluminum, or magnesium. As is known, reactive sputtering of materials like TiN and TaN can be accomplished by using a Ti or Ta target and including gaseous nitrogen in the plasma. Other combinations of metal targets and reactive gases are possible.

The target 12 includes an annularly shaped downwardly facing vault 18 opposed to a wafer 20 being sputter coated. The vault 18 could alternatively be characterized as an inverted annular trough or moat. The vault 18 has an aspect ratio of its depth to radial width of at least 0.5:1 and preferably at least 1:1. The tested embodiment had a vault width of 7.5 cm and an aspect ratio of 1.4:1. The vault 18 has an cylindrical outer sidewall 22 outside of the periphery of the wafer 20, a cylindrical inner sidewall 24 overlying the wafer 20, and a generally flat, annular vault top wall or roof 25 (which extends across the space between the annular sidewalls 22, 24 and closes the bottom of the downwardly facing vault 18). The sidewalls 20, 22 in this embodiment extend generally parallel to the central axis 16, and the roof 25 extends generally perpendicularly. The target 12 also includes a central portion forming a spindle 26 including the inner sidewall 24 and a generally planar face 28 spanning the space formed at the bottom terminus of the inner sidewall 24 in parallel opposition to the wafer 20. The target 12 is continuous across its parts 22, 25, 24, 28 with no structure intervening between these parts and the process space between the target 12 and the wafer 20. The target 12 also includes a flange 29 which extends radially outwardly from near the terminus of the outer sidewall 22 and which is vacuum sealed to the lower chamber body of the sputter reactor 10.

The magnetron 14 of the embodiment illustrated in FIG. 1 includes one or more central magnets 30 having a first vertical magnetic polarity and one or more outer magnets 32 of a second vertical magnetic polarity opposite the first polarity and arranged in an annular pattern. That is, one is N—S; the other, S—N. In this embodiment the magnets 30, 32 are permanent magnets, that is, composed of strongly ferromagnetic material and are stationary. The inner magnets 30 are radially disposed within or axially upward of a cylindrical central well 36 formed in the spindle 26 and between the opposed portions of the inner target sidewall 24 while the outer magnets 32 are disposed generally radially outside of the outer target sidewall 22. A circular magnetic yoke 34 magnetically couples tops of the inner and outer magnets 30, 32. The yoke is composed of a magnetically soft material, for example, a paramagnetic material, such as SS410 stainless steel, that can be magnetized to thereby form a magnetic circuit for the magnetism produced by the permanent magnets 30, 32. Permanently magnetized yokes are possible but are difficult to obtain in a circular geometry.

A cylindrical inner pole piece 40 of a similarly magnetically soft material abuts the lower ends of the inner magnets 30 and extends deep within the target well 36 adjacent to the inner target sidewall 24 to produce, in this case, a N pole within the well 36. (It is of course appreciated that the selection of an N or S pole is for the most part arbitrary because almost all practical magnetic effects depend only upon the relative polarities of different poles.) If the magnetron 14 is generally circularly symmetric, it is not necessary to rotate it for uniformity of sputter deposition. A tubular outer pole piece 42 of a magnetically soft material abuts the lower end of the outer magnets 32 and extends downwardly outside of the outer target sidewall 22. The magnetic pole pieces 40, 42 of FIG. 1 differ from the usual pole faces in that they and the magnets 30, 32 are configured and sized to emit a magnetic field B in the target vault 18 that is largely perpendicular to the magnetic field of the corresponding associated magnets 30, 32. In particular, the magnetic field B is generally perpendicular to the target vault sidewalls 22, 24.

This configuration has several advantages. First, the electrons trapped by the magnetic field B, although gyrating about the field lines, otherwise travel generally horizontally and radially with respect to the target central axis 16. Plasma sheaths are formed on both vault sidewalls 22, 24 which reflect electrons traveling along the magnetic field lines toward the vault sidewalls. As a result, the electrons are substantially bound within the vault 18, and electron loss is minimized, thus increasing the plasma density. Secondly, the vertical depth of the magnetic field B intensifying the plasma density is determined by the height of the target sidewalls 22, 24. This depth can be considerably greater than that of a high-density plasma region created by magnets in back of a planar target. As a result, sputtered atoms traverse a larger region of a high-density plasma and are accordingly more likely to become ionized. The support structure for the magnetron 14 and its parts is not illustrated but can be easily designed by the ordinary mechanic. The support structure usually includes an overlying cover shielding and supporting the magnetron.

The remainder of the sputter reactor 10 is similar to that described by Chiang et al. in the above referenced patent application although a short-throw rather than a long-throw configuration may be used. Long throw is defined by Chiang et al. as the separation between the target and wafer as being at least 80% and preferably at least 140% of the wafer diameter. The target 12 is vacuum sealed to a grounded vacuum chamber body 50 through a dielectric target isolator 52. The wafer 20 is clamped to a heater pedestal electrode 54 by, for example, a clamp ring 56 although electrostatic chucking is possible. An electrically grounded shield 58 acts as an anode with respect to the cathode target 12, which is negatively biased by a variable DC power supply 60. DC magnetron sputtering is conventional in commercial applications, but RF sputtering can enjoy the advantages of the target and magnetron of the invention and is especially advantageous for sputtering non-metallic targets. An electrically floating shield 62 is supported on the electrically grounded shield 58 or chamber 50 through a dielectric shield isolator 64. An annular cylindrical knob 66 extending downwardly from the outer target sidewall 22 and positioned inwardly of the uppermost part of the floating shield 62 protects the upper portion of the floating shield 62 and the target isolator 52 from being sputter deposited from the strong plasma disposed within and slightly vertically outwardly of the target vault 18. The gap between the upper portion of the floating shield 62 and the target knob 66 and flange 29 is small enough to act as a dark space preventing the plasma from propagating into the gap.

A working gas such as argon is supplied into the chamber from a gas source 68 through a mass flow controller 70. A vacuum pumping system 72 maintains the chamber at a reduced pressure, typically a base pressure in the neighborhood of $10^{-8}$ Torr. Although a floating pedestal electrode 54 can develop a desired negative self-bias, it is typical in high plasma-density sputtering for an RF power supply 74 to RF bias the pedestal electrode 54 through an isolation capacitor, which results in a controlled negative DC self-bias. A controller 76 regulates the power supplies 60, 74, mass flow controller 70, and vacuum system 72 according to a sputtering recipe prerecorded in it with recordable magnetic or optical media.

The target and magnetron structure has several advantages. As mentioned previously, secondary electrons are largely trapped within the vault 18 with little loss even upon collision with the target sidewalls 22, 24, more specifically reflected from the plasma sheaths adjacent the sidewalls. Also, the plasma thickness is relatively large, determined by the sidewall heights, thereby increasing the ionization fraction of the sputtered target atoms. The separation of the inner and outer poles 40, 42 is relatively small, thereby increasing the magnetic field intensity within the vault 18. The target 12 is continuous across the pole pieces 40, 42, thus preventing the magnetic material of the poles from being sputtered and deposited on the semiconductor wafer 20.

The relatively high ionization fraction allows this fraction of the sputtered target atoms to have their trajectories toward the wafer be controlled both by the magnetic field looping from the target toward the wafer and by the electric field induced by the DC self-bias applied to the pedestal. Increasing the DC self-bias draws the ions into high aspect-ratio holes, thereby allowing high bottom and sidewall coverage of such high aspect-ratio holes. On the other hand, the ionization fraction is less than 100%, and the remaining sputtered atoms are neutral. In some situations a finite neutral component is useful, and the ratio of neutrals to ions can be controlled by adjusting power levels and chamber pressures.

Figure 2:
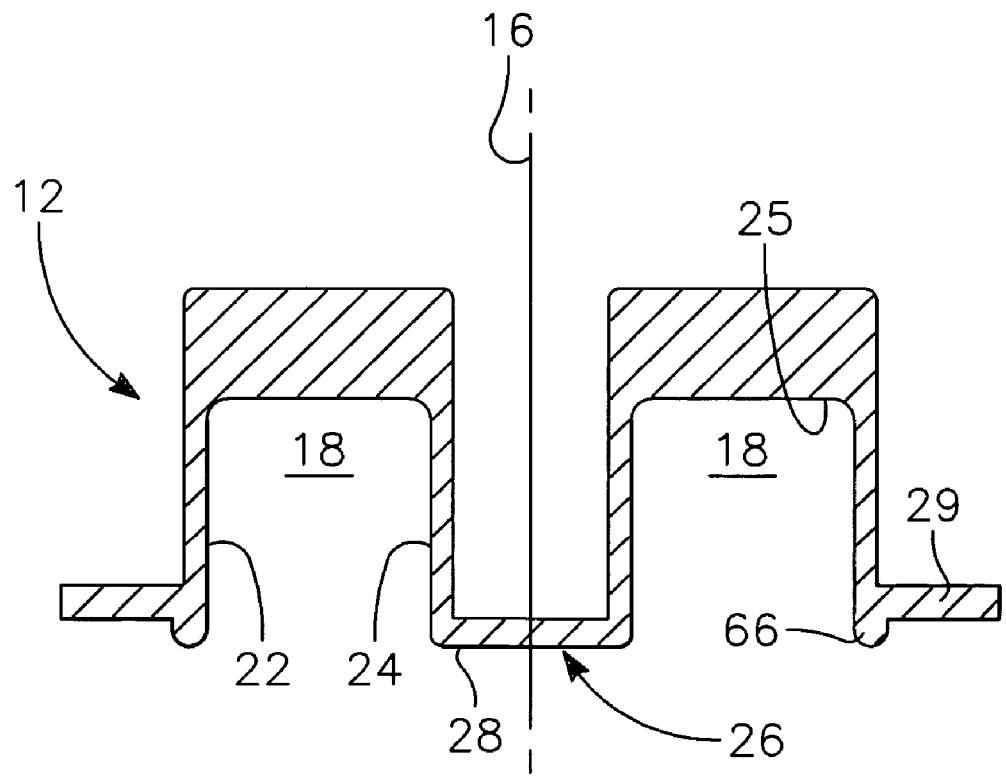
FIG. 2 is a schematic cross-sectional diagram illustrating the collimating function of the target of the invention.
Figure 2:
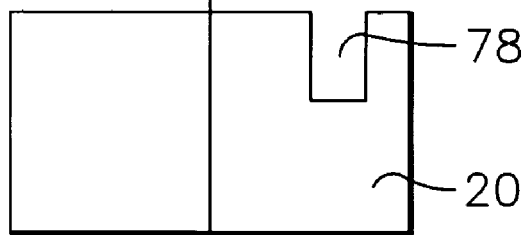

The high aspect ratio of the vault 18 also improves the symmetric filling of holes located near the edge of the wafer, particularly in configurations having a shorter throw than that illustrated in FIG. 1. As schematically illustrated in FIG. 2, a hole 78 located at the right edge of the wafer 20 is to have a conformal layer sputter deposited on its sides. The size of the hole 78 and the thickness of the wafer 20 are greatly exaggerated, but the geometry remains approximately valid. If a planar target were being used, the right side of the wafer hole 78 would see a much larger fraction of the target than the left side and would thus be coated with a commensurately thicker layer. However, with the vault-shaped target 12, the hole 78 sees neither the inner sidewall 24 of the left side of the vault 18 nor the left vault top wall 25. Even the upper portion of the outer sidewall 22 of the left side of the vault 18 is shielded from the wafer hole 78 by the inner sidewall 24 of the left side of the vault 18. As a result, the two sidewalls of the hole 78 to be coated see areas of the vault-shaped target that are much closer in size than for a planar target, and the sidewall coating symmetry is thereby greatly increased.

The target structure, as a result, can provide sputtered particles having trajectories preferentially aligned perpendicularly to the wafer surface, but without an apertured collimator, which tends to become clogged with sputtered material. The effect is increased by a high aspect ratio for the vault, preferably at least 1:2, and more preferably at least 1:1. The tested target had a vault with an aspect ratio of 1.4:1.

Figure 3:
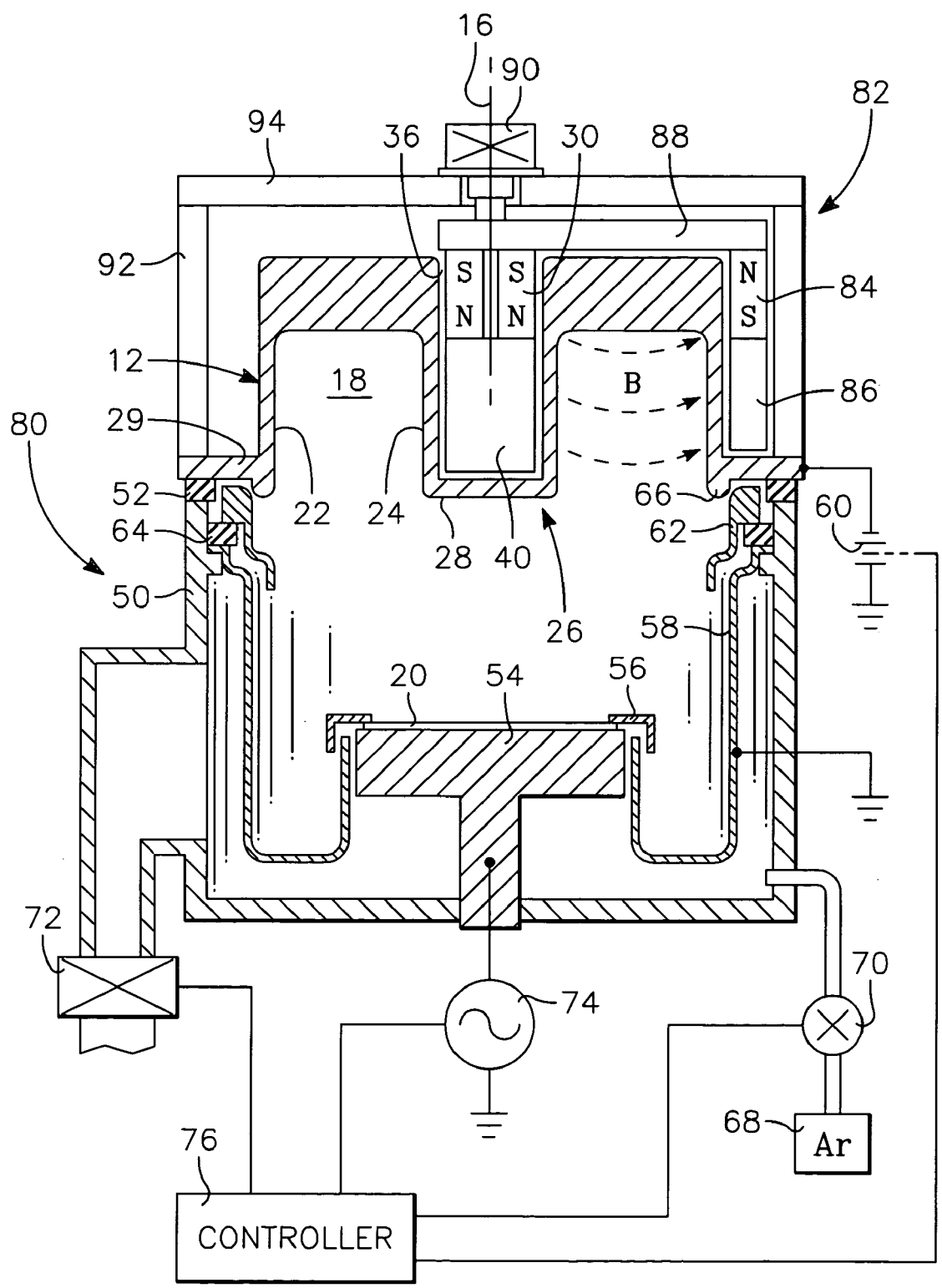
FIG. 3 is a schematic cross-sectional view of a second embodiment of a magnetron sputter reactor of the invention using a rotating, segmented magnetron with vertically magnetized magnets.

A sputter reactor 80 of second embodiment of the invention is illustrated in the schematic cross-sectional view of FIG. 3. A magnetron 82 includes the previously described inner magnets 30 and inner pole piece 40. However, one or more outer magnets 84 and an outer pole piece 86 extend around only a segment of the circumference of the target, for example between 15° and 90°. An asymmetric magnetic yoke 88 shaped as a sector magnetically couples the inner and outer magnets 30, 84 but only on the side of target well 36 toward the outer magnets 84. In fact, a circular yoke 88, although larger, would not affect the operative magnetic field. As a result, a high-density plasma is generated in only a small circumferential portion of the target vault 18. For self-ionized plating (SIP) and particularly sustained self-sputtering (SSS), a high plasma density is desired. In view of the limited capacity of realistic power supplies 60, the high plasma density can be achieved by reducing the volume of the magnetron 82.

To achieve uniform sputtering, a motor 90 is supported on the chamber body 50 through a cylindrical sidewall 92 and roof 94 preferably electrically isolated from the biased target flange 29. The motor 90 has a motor shaft connected to the yoke 88 at the target axis 16 and rotates the magnetron 82 about that axis 16 at a few hundred rpm. Mechanical counterbalancing may be provided to reduce vibration in the rotation of the axially offset magnetron 82. The mechanical details are not accurately represented in FIG. 3 but will be described more completely below.

Figure 4:
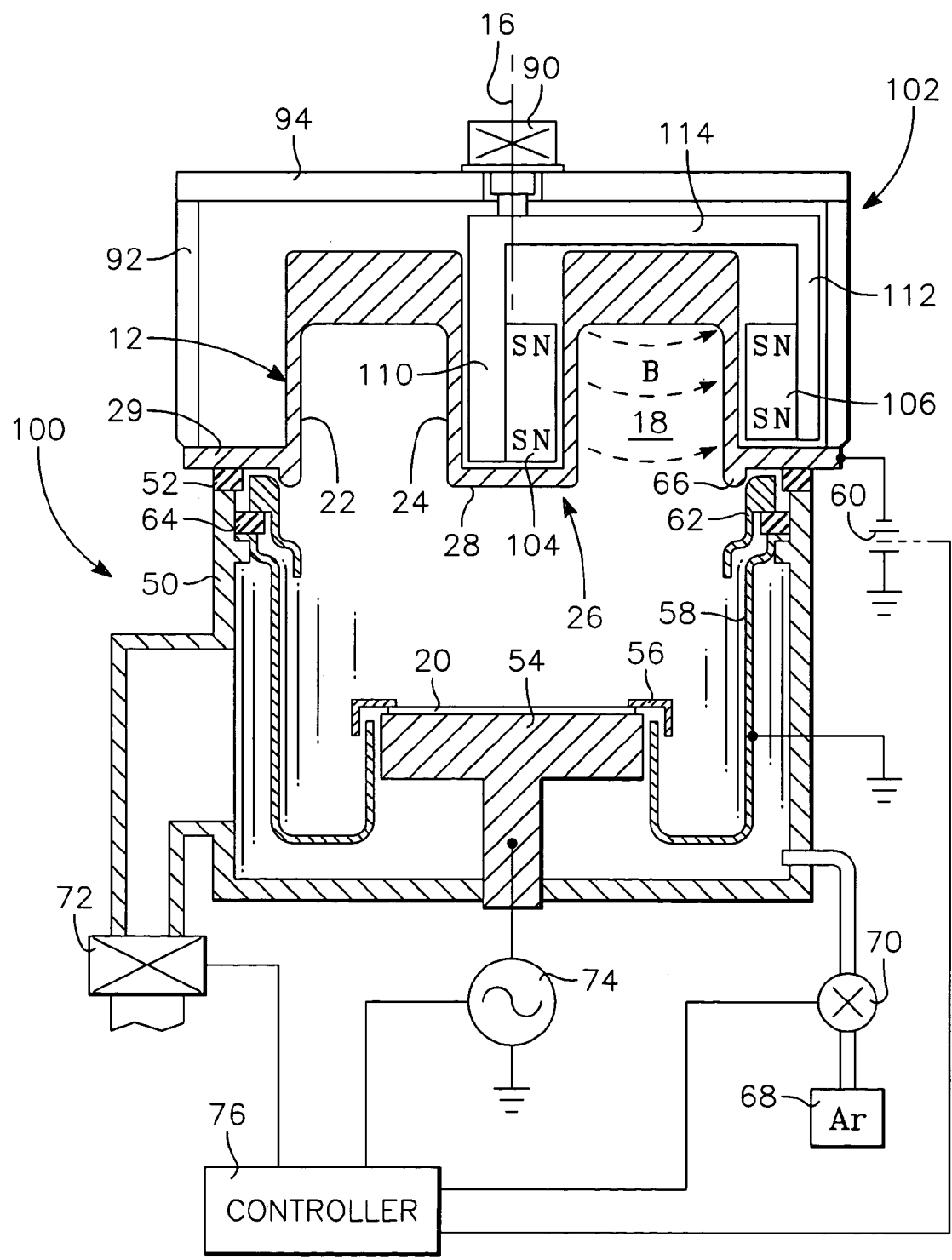
FIG. 4 is a schematic cross-sectional view of a third embodiment of a magnetron sputter reactor of the invention using a rotating, segmented magnetron with radially magnetized magnets.

Other magnet configurations are possible to produce similar magnetic field distributions. A sputter reactor 100 of a third embodiment of the invention is illustrated in the schematic cross-sectional view of FIG. 4 A magnetron 102 includes an inner magnet 104 having a magnetization direction generally aligned with a radius of the target 12 about the target axis 16. One or more outer magnets 106 are similarly radially magnetized but anti-parallel to the magnetization of the inner magnet 104 with respect to the center of the vault 18. A C-shaped magnetic yoke has two arms 110, 112 in back of and supporting the respective magnets 104, 106 and a connector 114 supported on and rotated by the shaft of the motor 90.

The magnets 104, 106 may be advantageously positioned only on reduced circumferential portions of the sidewalls 24, 22 of the target vault 18 so as to concentrate the magnetic field there. Furthermore, in this configuration extending along only a small segment of the target periphery, the magnets 104, 106 may be conveniently formed of plate magnets.

Figure 5:
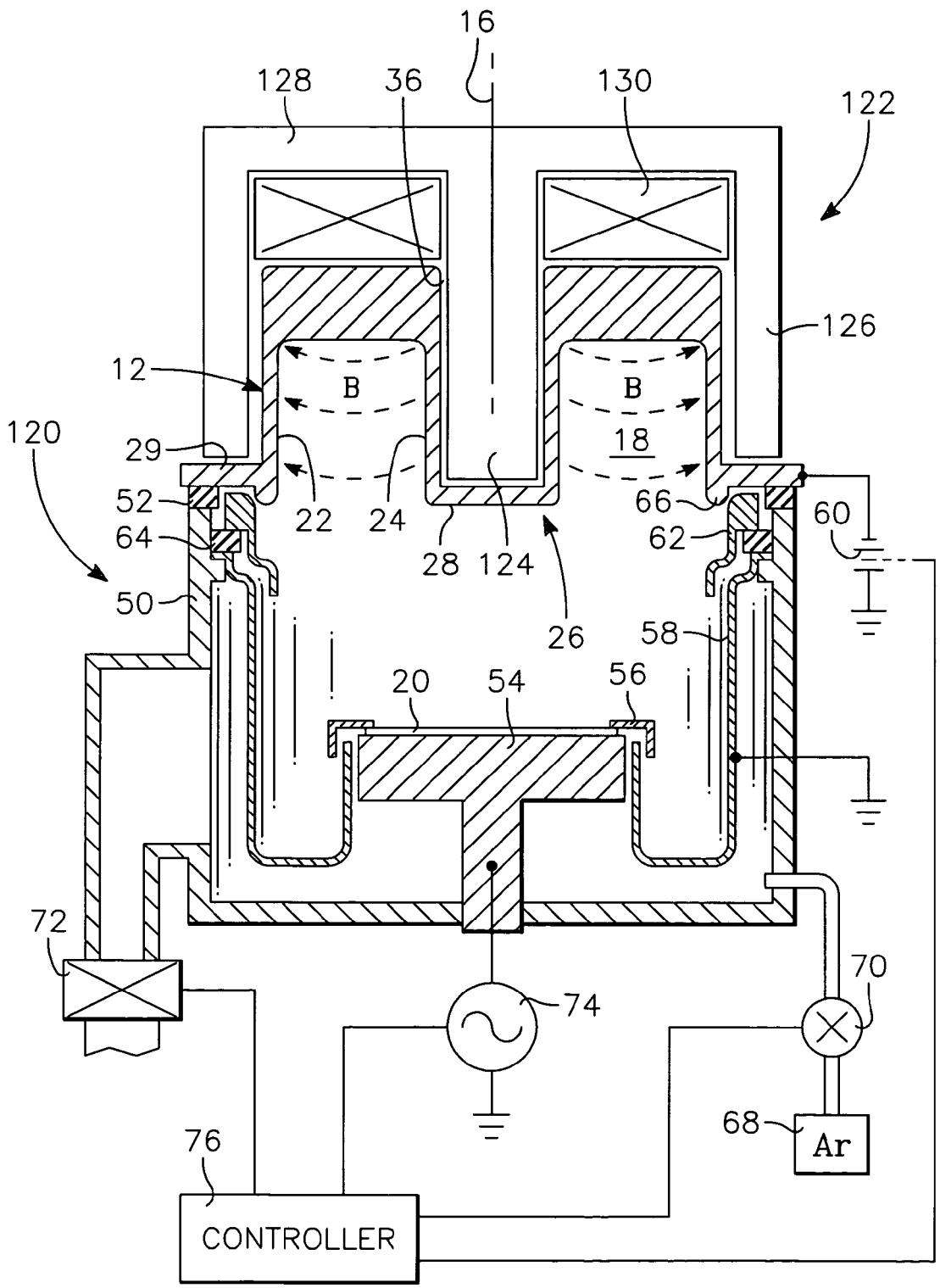
FIG. 5 is a schematic cross-sectional view of a fourth embodiment of a magnetron sputter reactor of the invention using an electromagnetic coil.

Electromagnetic coils may replace the permanent magnets of the previously described embodiments. A sputter reactor 120 of a fourth embodiment of the invention is illustrated in the schematic cross-sectional view of FIG. 5. A magnetron 122 includes a magnetic yoke including a central spindle 124 fit into the well 36 of the target 12 and a tubular rim 126 surrounding the outer sidewall 24 of the target vault 18. The magnetic yoke also includes a generally circular back piece 128 magnetically coupling the spindle 124 and the rim 126. An electromagnetic coil 130 is wound around the spindle 124 below the back piece 128 and inside of the rim 126. The coil 130 is preferably powered by a DC electrical source but a low-frequency AC source can be used. The coil 130 in conjunction with the magnetic yoke creates a generally radial magnetic field in the target vault 18.

The previously described embodiments have emphasized sputtering the vault sidewalls 22, 24 preferentially to sputtering the vault top wall or roof 25 (see FIG. 1) since relatively few of the magnetic field lines terminate on the vault roof 25. The metal ionization fraction can be increased if sputtering is increased in the vault roof 25 since the plasma thickness experienced by the average sputtered atom is increased. Also, the directionality of sputtered material leaving the vault 18 is increased.

Figure 6:
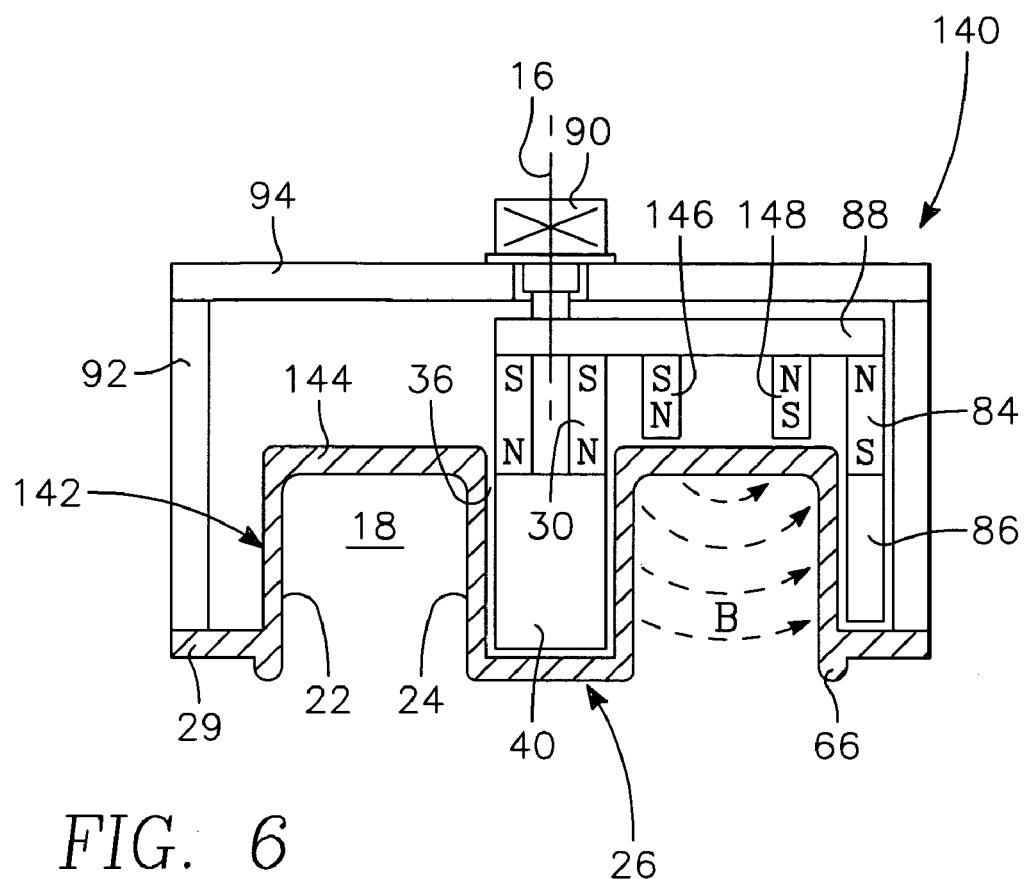
FIG. 6 is a cross-sectional view of a fifth embodiment of a magnetron of the invention using additional magnets at the roof of the vault to increase the roof sputtering.

The increased roof sputtering can be achieved in a number of ways. In a fifth embodiment of a magnetron 140 illustrated in cross-section in FIG. 6 with the remainder of the sputtering chamber being similar to the parts illustrated in FIG. 3. A target 142 is similar to the previously described target 12 except for a thinner roof portion 144. Similarly to the magnetron 82 of FIG. 3, it includes the rotatable yoke 88 supporting the inner magnets 30 of a first vertical polarity magnetically coupled to the inner pole piece 40 and the outer magnets 84 of a second vertical polarity magnetically coupled to the outer pole piece 86. These magnets 30, 84 and pole pieces 40, 86 produce a generally radial magnetic field B extending between the sidewalls 22, 24 of the vault 18. The magnetron 82 additionally supports on the magnetic yoke 88 an inner roof magnet 146 of the first vertical polarization aligned with the inner magnets 30 and an outer roof magnet 148 of the second vertical polarization aligned with the outer magnets 86. The opposed roof magnets 146, 148 magnetically coupled by the yoke 88 produce a semi-toroidal magnetic field B penetrating the vault roof 144 at two locations. Thereby, electrons are trapped along the semi-toroidal magnetic field and increase the plasma density near the vault roof 144, thereby increasing the sputtering of the vault roof 144.

In the illustrated embodiment, the outer magnets 84 and outer pole piece 86 occupy only a segment of the periphery of the target 142 but are rotated along that periphery by the motor 90. Similarly, inner and outer roof magnets 146, 148 extend only along a corresponding segment angle. However, a corresponding non-rotating magnetron can be created by making the roof magnets 146, 148, outer magnet 84, and outer pole piece 86 in annular shapes. The same circularly symmetric modification may be made to the embodiments described below.

Figure 7:
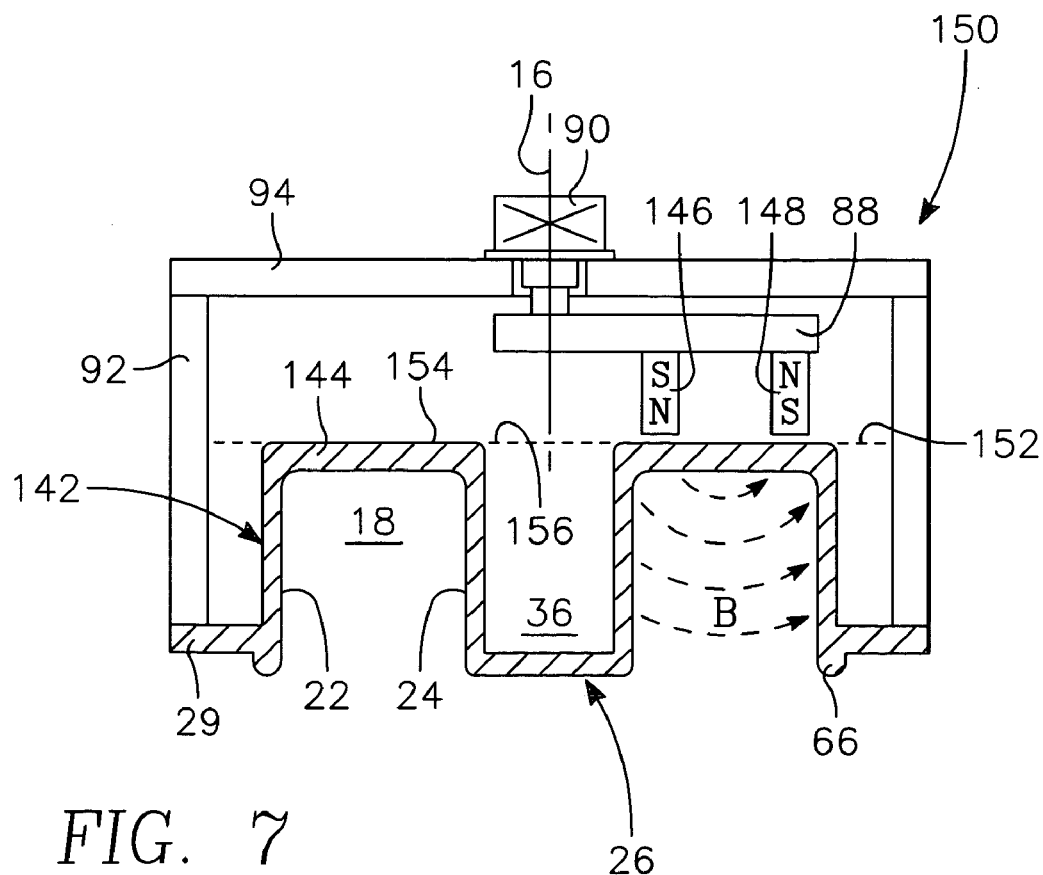
FIG. 7 is a cross-sectional view of a sixth embodiment of a magnetron of the invention using only the vault magnets.

The roof sputtering can be further emphasized by a sixth embodiment of a magnetron 150, illustrated in FIG. 7, which includes the inner and outer roof magnets 146, 148 but which in the illustrated embodiment includes neither the inner magnets within the well 36 nor the outer magnets outside of the outer sidewall 22. This configuration produces a relatively strong semi-toroidal magnetic field B adjacent to the vault roof 144 and a weaker magnetic field B in the body of the vault 18 adjacent to the sidewalls 22, 24. Therefore, there will be much more sputtering of the roof 144 than of the sidewalls 22, 24. Nonetheless, magnetic field lines in the vault body terminate at the sidewalls 22, 24, thereby decreasing electron loss out of the plasma. Hence, the magnetic field intensity may be low in the vault, but the plasma density is still kept relatively high there so that the target atoms sputtered from the roof 144 still traverse a thick plasma region and are accordingly efficiently ionized.

Since no magnets or pole pieces are placed in the target well 36 or outside of the outer target sidewall 22 and assuming the target material is non-magnetic, the inner and outer sidewalls 24, 22 may be increased in thickness even to the point that there is no well and no appreciable volume between the outer sidewall 22 and the chamber wall. That is, the back of the target 142 may have a substantially planar face 152, 154, 156. However, the inventive design of this embodiment still differs from a target having a circularly corrugated surface in that the spacing of the opposed roof magnets 146, 148 is at least half of the radial vault dimension and preferably closer to unity. This is in contrast to the embodiments of FIGS. 1, 3, and 4 in which the two sets of magnets are separated preferably by between about 100% and 150% of the vault width. Alternatively stated, the width of the vault 18 in the radial direction should be at least 2.5 cm, preferably at least 5 cm, and most preferably at least 10 cm. These dimensions, combined with the vault aspect ratio being at least 1:2 assures that the vault width is at least 10 times and preferably at least 25 times the plasma dark space, thus guaranteeing that the plasma conforms to the shape of the vault 18. These vault widths are easily accommodated in a sputter reactor sized for a 200 mm wafer. For larger wafers, more complex target shapes become even easier to implement.

Figure 8:
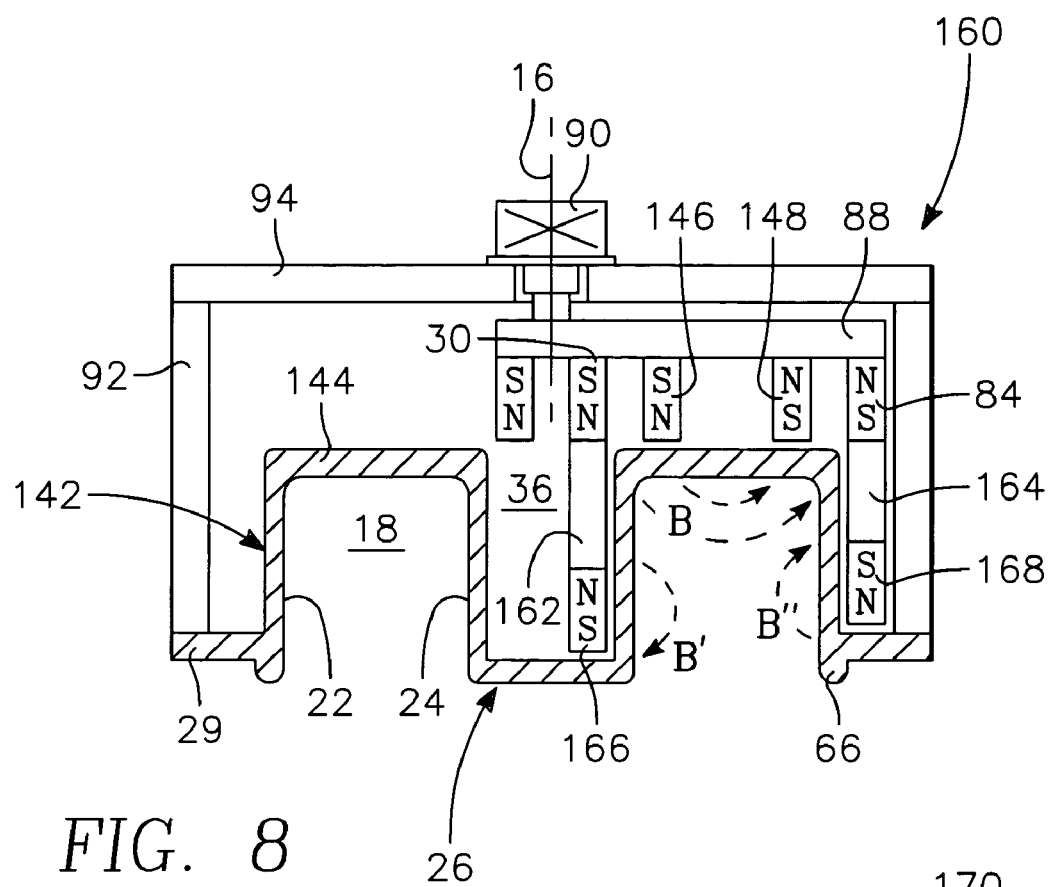
FIG. 8 is a cross-sectional view of a seventh embodiment of a magnetron of the invention using additional confinement magnets at the bottom sidewall of the vault.

A seventh embodiment of a magnetron 160 illustrated in the cross-sectional view of FIG. 8 includes the inner and outer main magnets 30, 84, although they are preferably somewhat shorter and do not extend below the vault roof 144. The magnetron also includes the inner and outer roof magnets 146, 148. However, neither the inner pole piece nor the outer pole piece needs to be used to couple the magnetic field from the main magnets 30, 84 into the vault 18. Instead, all these magnets produce a horizontally oriented semi-toroidal field B adjacent the vault roof 144. Some of these magnets may be eliminated as long as there are opposed magnets associated with the inner and outer target sidewalls 22, 24. Instead of ferromagnetic or paramagnetic pole pieces, non-magnetic (e.g. aluminum or hard stainless steel) or even diamagnetic spacers 162, 164 are supported below the inner and outer main magnets 30, 84 respectively. Henceforth, non-magnetic materials will be assumed to include diamagnetic materials unless specifically stated otherwise. The inner spacer 162 supports on its lower end an inner sidewall magnet 166 of the second magnetic polarity, that is, opposite that of its associated main inner magnet 30. Similarly, the outer spacer 164 supports on its lower end an outer sidewall magnet 168 of the first magnetic polarity, that is, opposite that of its associated main outer magnet 84. Both the sidewall magnets 166, 168 are located near the bottom of the respective vault sidewalls 24, 22. Because, they have polarities opposed to those of their associated main magnets 30, 84 they create two generally vertically extending semi-toroidal magnetic fields B' and B" near the bottom of the vault sidewalls 24, 22. Because of their opposed magnetic orientations, the sidewall magnets 166, 168 create two anti-parallel components of radial magnetic field across the vault 18. However, because of the relative spacings of the poles, the semi-toroidal magnetic fields B' and B" dominate.

In one sub-embodiment, the horizontally extending magnetic field B near the vault roof 144 is much stronger than the vertically extending magnetic fields B' and B''' near the vault sidewalls 24, 22. As a result, sputtering of the roof 144 predominates. Alternatively, increased sidewall fields B' and B" can increase the amount of sidewall sputtering in a controlled way. In any case, the vertically extending sidewall fields B' and B" are sufficient to support a plasma throughout much of the body of the vault 18. Also, the sidewall fields B' and B" are oriented to repel electrons in the plasma flux from the roof 144, thereby decreasing the electron loss of that plasma.

Figure 9:
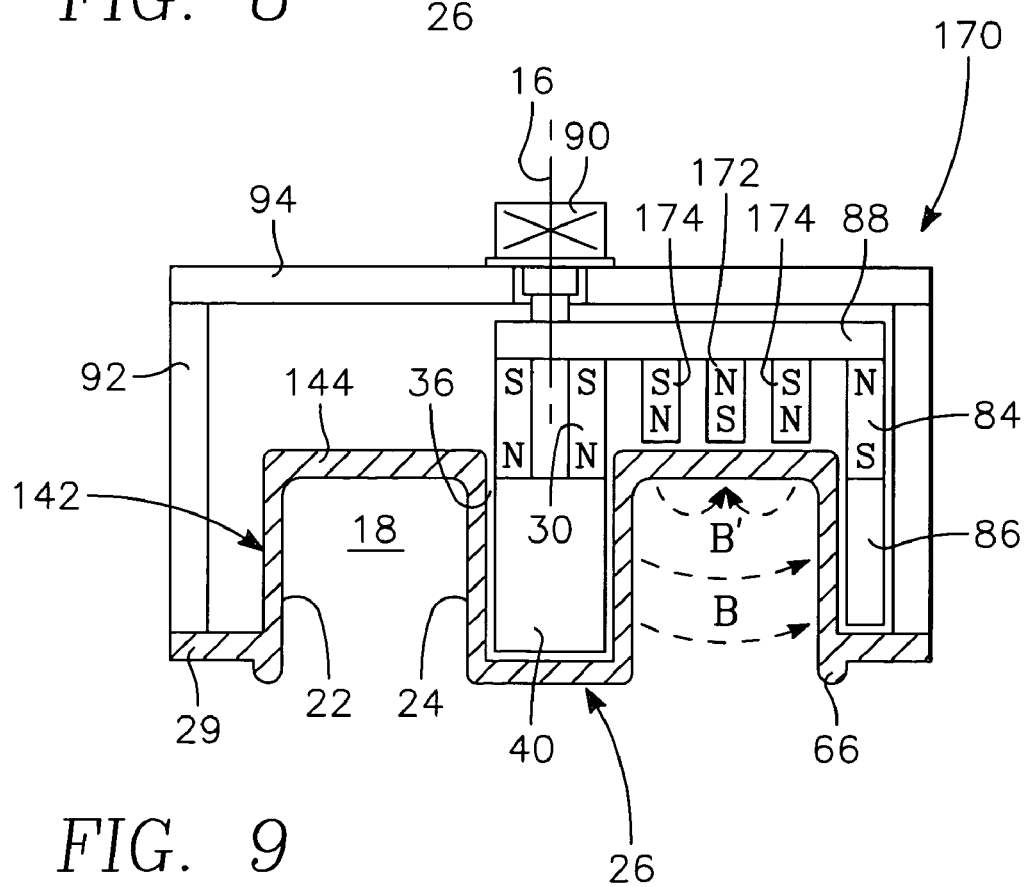
FIG. 9 is a cross-sectional view of an eighth embodiment of a magnetron of the invention using a closed magnetron over the vault roof and separate magnets for the vault sidewalls.

All of the previous embodiments have used magnets that extend generally along either the entire circumference or a segment of the circumference of various radii of the target. However, an eighth embodiment of a magnetron 170 illustrated in the cross-section view of FIG. 9 treats the planar vault roof 144 distinctly differently than the band-shaped vault sidewalls 22, 24. The sidewall magnetic assembly is similar to that of FIG. 6 and includes the rotatable yoke 88 supporting the inner magnets 30 of a first vertical polarization magnetically coupled to the inner pole piece 40 and the segmented outer magnets 84 of an opposed second vertical polarization magnetically coupled to the outer pole piece. These produce a generally radially directed magnetic field B across the vault 18. The rotating magnetic yoke 88 also supports a closed magnetron over the vault roof 144 including an inner magnet 172 of one vertical magnetic polarization and a surrounding outer magnet 174 of the other vertical magnetic polarization producing between them a cusp-shaped magnetic field B' adjacent the vault roof 144. In the simplest sub-embodiment, the inner magnet 172 is cylindrical, and the outer magnet 174 is annular or tubular, surrounds the inner magnet 172, thereby producing a circularly symmetric cusp field B'. However, other shapes are possible, such as a radially or circumferentially aligned racetrack or a pair of nested segment-shaped magnets. The roof magnetron of FIG. 9 is the general type of magnetron described by Fu and by Chiang et al. in the previously referenced patent applications for SIP sputtering of a planar target, and those references provide guidance on the design of such a closed unbalanced magnetron having a strong outer pole surrounding a weaker inner pole of the opposite polarity.

The figure does not adequately illustrate the magnetic yoke 88 which in the conceptually simplest implementation would magnetically isolate the roof magnets 172, 174 from the sidewall magnets 30, 84 while still magnetically coupling together the roof magnets 172, 174 and separately coupling together the sidewall magnets 30, 84. However, in view of the large number of magnets, a more complex magnetic circuit can be envisioned.

As has been shown in the cited patent applications, such a small closed roof magnetron will be very effective in highly ionized sputtering of the target roof 144. The sidewall magnets 30, 84 on the other hand will extend the plasma region down the height of the sidewalls 22, 24 as well as cause a degree of sidewall sputtering depending on the relative magnetic intensities.

The relative magnetic polarizations of roof magnets 172, 174 relative to those of the sidewall magnets 30, 84 may be varied. Also, the sidewall magnets 30, 84 and particularly the outer sidewall magnet 84 may be made fully annular so as to close on themselves so that optionally they do not need to be rotated and may be coupled by their own stationary yoke while the roof magnets 172, 174 do rotate about the circular planar area on the back of the vault roof 144 and are coupled by their rotating own yoke.

Other combinations of the closed roof magnetron and the sidewall magnets of other embodiments are possible.

Figure 10:
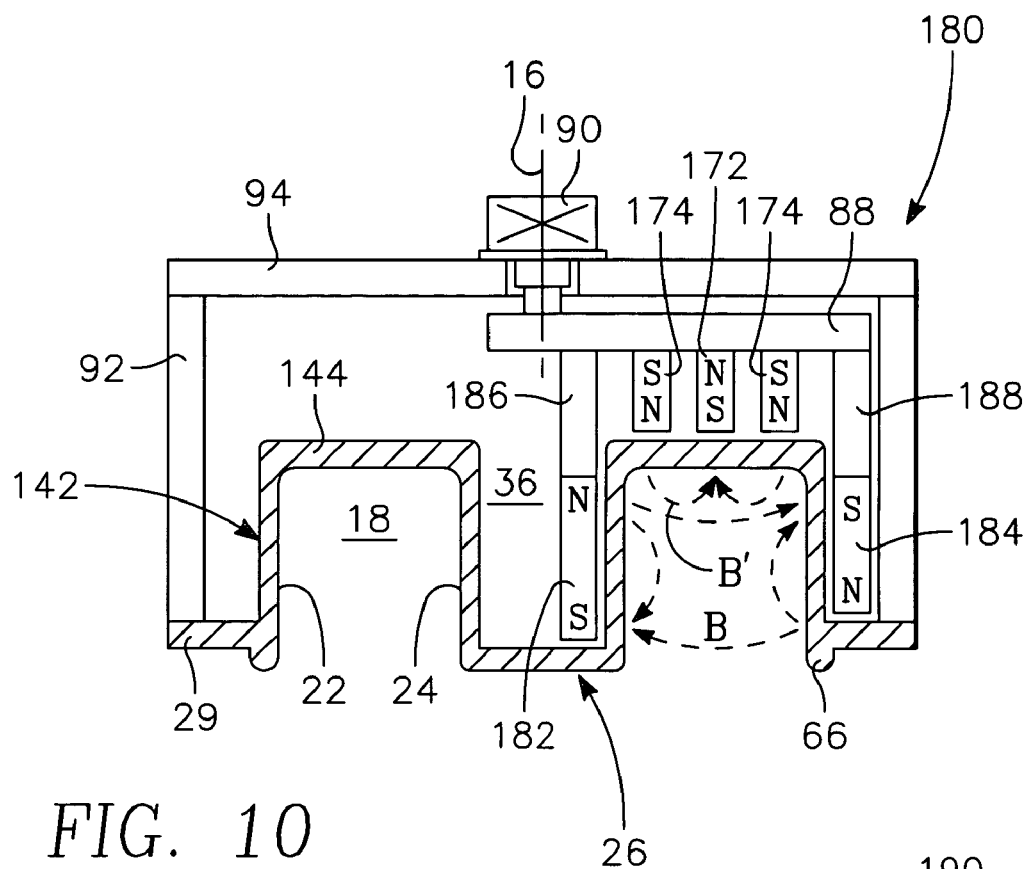
FIGS. 10–12 are cross-sectional views of ninth through eleventh embodiments of magnetrons of the invention.

A ninth embodiment of a magnetron 180 of the invention is illustrated in the cross-sectional view of FIG. 10 and includes the inner and outer magnets 172, 174 overlying the vault roof 144. Side magnets 182, 184 disposed outside of the vault sidewalls 142 have opposed vertical magnetic polarities but they are largely decoupled from the roof magnets 172, 174 because they are supported on the magnetic yoke 88 by non-magnetic supports 186, 188. As a result, the side magnets 182, 184 create a magnetic field B in the vault 18 that has two generally anti-parallel components extending radially across the vault 18 as well as two components extending generally parallel to the vault sidewalls. Thus, the magnetic field B extends over a substantial depth of the vault 18 and further repels electrons from the sidewalls. In the illustrated embodiment, all the side magnets 182, 184 are segmented and rotate with the roof magnets 172, 174. However, a mechanically simpler design forms the side magnets 182, 184 in annular shapes and leaves one or both of them stationary. As illustrated, the polarities are such that the top pole of the inner side magnet 182 has the same polarity as the bottom pole of the adjacent annular top magnet 174 while the outer side magnet 184 has the opposite relationship with the annular top magnet 174. However, these polarities may be varied.

Figure 11:
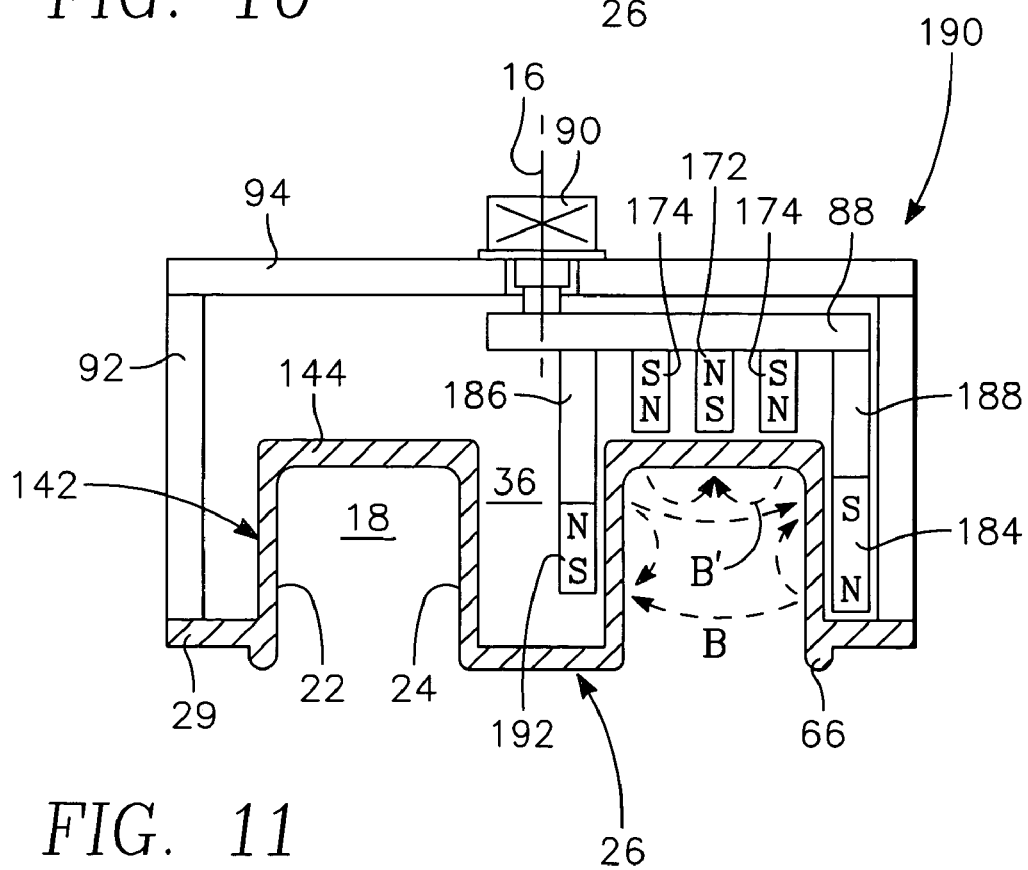

A tenth embodiment 190 illustrated in the cross-sectional view of FIG. 11 is similar to the magnetron 180 of FIG. 10 except that an inner side magnet 192 is smaller than the outer side magnet 184, thereby allowing tailoring of the magnetic fields on the two vault sidewalls. The opposite size relationship is also possible.

Figure 12:
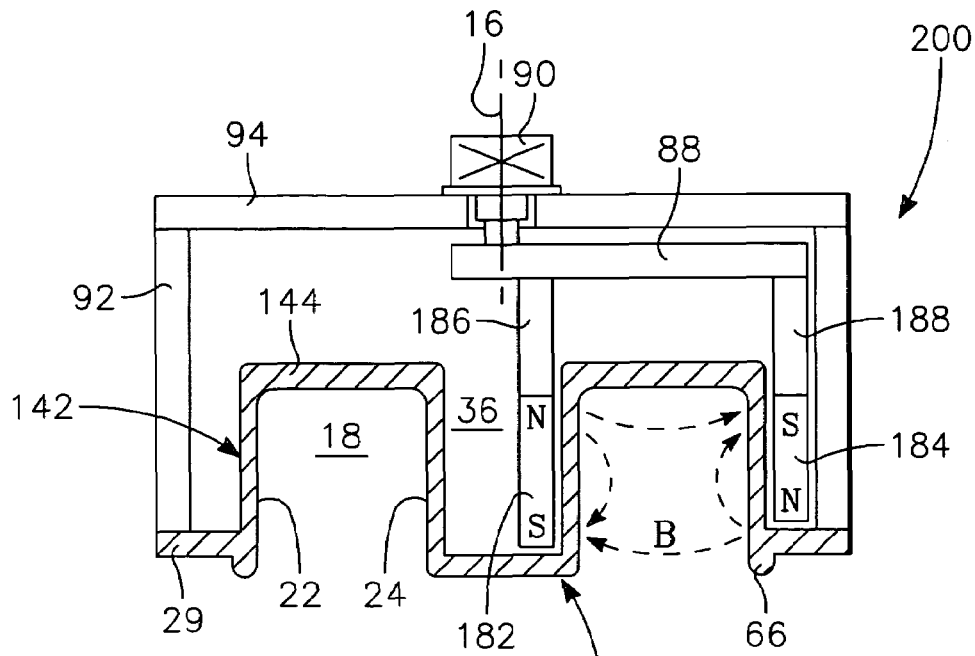

An eleventh embodiment 200 illustrated in the cross-sectional view of FIG. 12 dispenses with the top magnets and uses only the two side magnets 182, 184 which may be of the same size or of unequal size. In this case, the yoke 88 need not be magnetic.

Figure 13:
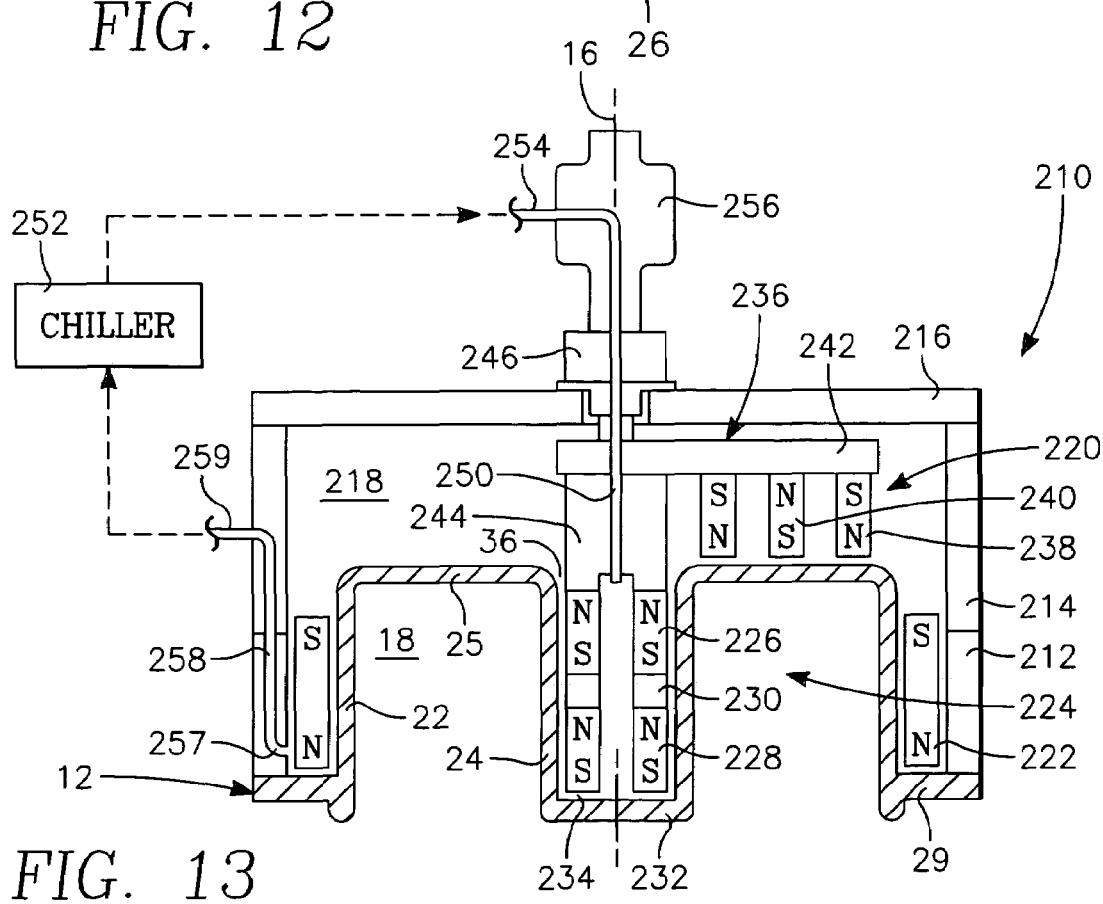
FIGS. 13 and 14 are respectively a cross-sectional view and a schematic plan view of a twelfth embodiment of the invention using stationary outer sidewall magnets and rotating inner sidewall magnets.

A twelfth embodiment 210 illustrated in the cross-sectional side view of FIG. 13 is the subject of U.S. patent application Ser. No. 09/703,738, filed on Nov. 11, 2000 by A. Subramani et al., now issued as U.S. Pat. No. 6,406,599, incorporated herein by reference in its entirety. This embodiment has similar functionality to that of FIG. 10 but has further capabilities.

The illustrated upper part of the sputtering chamber includes a cylindrical wall composed of a bottom frame 212 and a top frame 214, on which is supported a chamber roof 216. The SIP+ vault-shaped target 12 is fixed to the bottom frame 212. All these parts are sealed together to allow cooling water to circulate in a space 218 in back of the target 12. The vault-shaped target 12 includes the annular vault 18 having the outer sidewall 22, the inner sidewall 24, and the vault roof 25, all generally circularly symmetric with respect to the vertical chamber axis 16. The inner and outer vault sidewalls 22, 24 extend generally parallel to the chamber axis 16 while the vault roof 25 extends generally perpendicularly thereto. That is, the vault 18 is annularly shaped with a generally rectangular cross section.

A magnetron 220 is placed in back of the vaulted target 12 in close association with the vault 18. The magnetron 220 includes a stationary ring-shaped outer sidewall magnet assembly 222 placed outside the outer vault sidewall 22 and having a first vertical magnetic polarity. The preferred structure for the outer sidewall magnets 224 is more complicated than that illustrated, as is described in the patent application to Subramani et al., but the functions remain much the same. A rotatable inner sidewall magnet assembly 224 includes an upper tubular magnet 226 and a lower tubular magnet 228 separated by a non-magnetic tubular spacer 230 having an axial length at least half the respective lengths of the two tubular magnets 226, 228. The two tubular magnets 226, 228 have a same second vertical magnetic polarity opposite that of the outer sidewall magnet 222. However, the non-magnetic spacer 230 is not required, and other magnet configurations may be selected to achieve a desired erosion pattern. The bottom of the lower tubular magnet 228 is separated from the back of a central planar portion 232 of the vaulted target 12 by a small gap 234 having an axial extent of between 0.5 to 1.5 mm.

The magnetron also includes a rotatable roof magnet assembly 236 in a nested arrangement of an outer ring magnet 238, generally circularly shaped, having the first magnetic polarity surrounding an inner rod magnet 240 having the second magnetic polarity and a magnetic yoke 242 supporting and magnetically coupling the magnets 238, 240. It is preferred that the total magnetic flux of the outer ring magnet 238 be substantially greater than that of the inner magnet 240, for example, having a ratio of at least 1.5. It is preferred, although not required, that the magnetic polarity of the outer ring magnet 238 be anti-parallel to that of the inner sidewall magnet 224 so as to avoid strong magnetic fields adjacent to the inner upper corner of the target vault 18 and instead to intensify the magnetic field at the outer upper corner, which is being more quickly scanned. The metal ions produced in the very high-density plasma adjacent the roof are focused by the outer sidewall magnets 222 and the inner sidewall magnet 224 into a column directed to the wafer.

Both the inner sidewall magnet 224 and the roof magnet assembly 236 are rotatable about the chamber axis 16. The inner sidewall magnet 224 is connected to and supported by a shaft 244 rotated about the chamber axis 16 by a motor 246. The magnetic yoke 242 supporting the roof magnets 238, 240 is also fixed to the rotating shaft 244.

The motor shaft 244 and the inner sidewall magnet 224 includes an inner passageway 250 configured for passage of cooling fluid, usually water, supplied from a chiller 252 through an inlet port 254 to a rotary union 256 connected to the motor shaft 244. The cooling water flows from the bottom of the inner sidewall magnet 224 through the gap 234 at the bottom of the inner sidewall magnet 224. It then flows upwardly between the inner vault sidewall 24 and the inner sidewall magnet 224. The rotating roof magnet assembly 236 stirs up the cooling water in the back of the target 12, thereby increasing its turbulence and cooling efficiency. The cooling water then flows down next to the outer vault sidewall 22. As explained by Subramani et al., the tubular outer sidewall magnet assembly 222 is composed of a large number of rod magnets, and they are separated from the actual walls of the target 12. As a result, the cooling water can flow both through and below the outer sidewall magnet 222 to one of several outlets 257 in the bottom frame 212 and then through several risers 258 in the frames 212, 214 to an outlet port 259 in the upper frame 214, whence the warmed cooling water is returned to the chiller 252. This cooling design has the advantage of supplying the coldest water to the hottest, central portions of the target 12.

Figure 14:
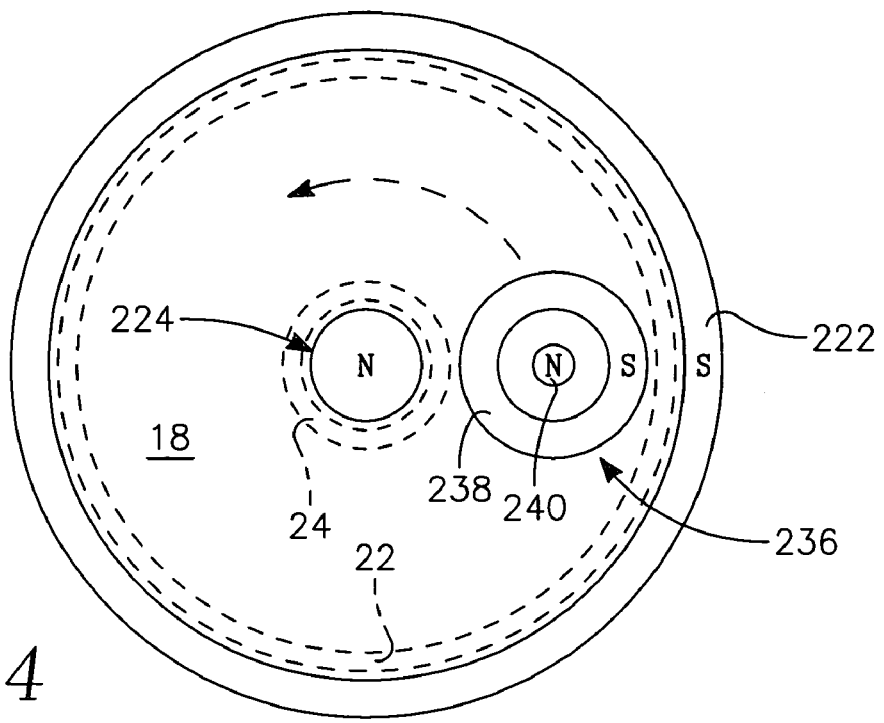

Even though the inner sidewall magnet 224 is rotating, its circular symmetry causes it to produce the same magnetic field as that produced by a stationary cylindrical magnet. A schematic plan view of the magnets is shown in FIG. 14. This figure is intended to represent the effective magnetic poles rather than actual magnets. The labeled polarities correspond to the uppermost poles and do not necessarily reflect the effective polarities within the vault 18. The inner sidewall magnet 224 is included within the inner vault sidewall 24 and is essentially circularly symmetric even though it may be rotating. Similarly the outer sidewall magnet 222 is positioned on the radial exterior of the outer vault sidewall 22, and it also is substantially circularly symmetric. The roof magnet assembly 236 including the outer and inner roof magnets 238, 240 is positioned over the vault roof between the outer and inner sidewalls 22, 24, and it rotates about the center of the target. It is apparent that the roof magnet assembly 236 occupies less than 20% of the area of the vault 18, and its effective magnetic fields occupy less than 10%. These factors provide corresponding increases in effective target power densities. Nonetheless, circumferential scanning provides uniform sputtering of the target.

Figure 15:
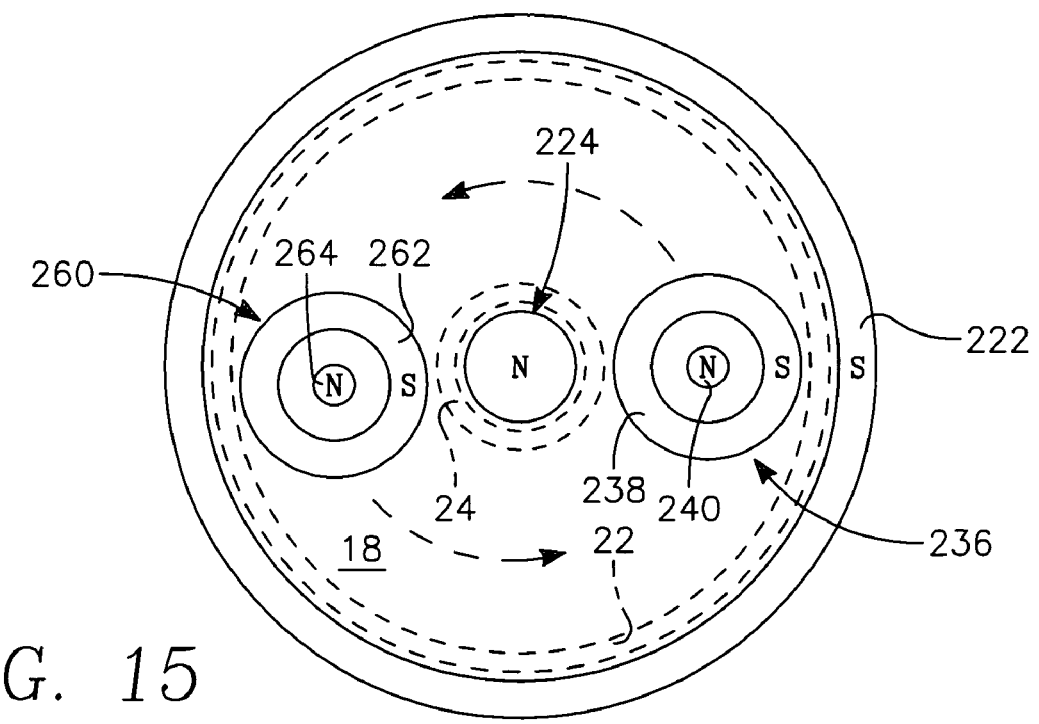
FIG. 15 is a schematic plan view of a variant of the twelfth embodiment.

It is possible to increase the number of roof magnet assemblies. For example, as illustrated in the schematic plan view of FIG. 15, a second roof magnet assembly 260 has outer and inner magnets 262, 262 of sizes and polarities matched to those of the first roof magnet assembly 236. The second roof magnet assembly 260 is disposed over the vault 18 diametrically opposite the first roof magnet assembly 236 and is rotated with it. Additional roof magnet assemblies may be added. While the multiple roof magnet assemblies increase the sputtering rate, particularly of metal ions, they require additional power to achieve the same peak plasma density.

Figure 16:
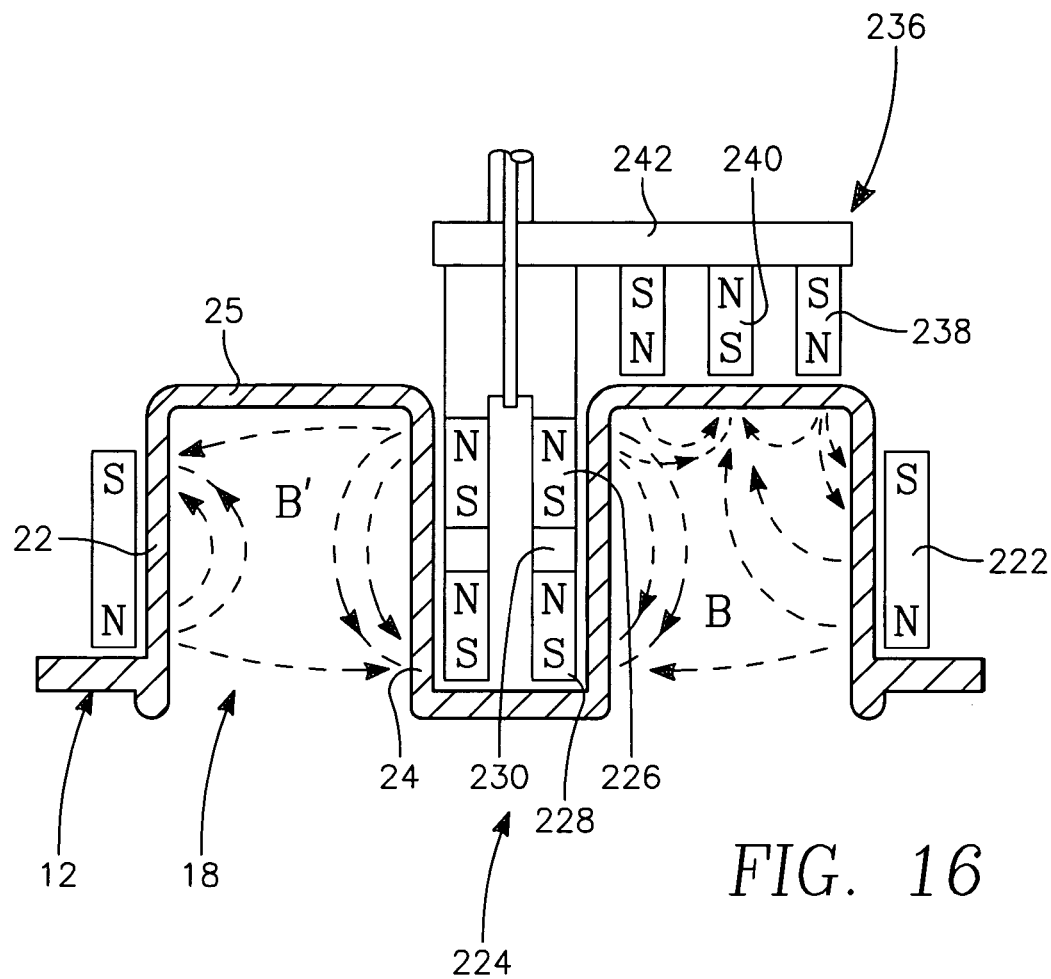
FIG. 16 is a cross-sectional view of the target and magnetron of the twelfth embodiment illustrating the resultant magnetic field.

The asymmetry between the roof magnet assembly 236 and the sidewall magnets 222, 234 for the embodiment of FIGS. 13 and 14 produces distinctly different magnetic field strengths and distributions in different parts of the vault 18, as is schematically illustrated in FIG. 16. In the portion of the vault 18 with the roof magnet assembly 236, there is a strong magnetic field B adjacent the vault roof 25. With the illustrated magnetic polarities, the magnetic field is relatively weaker at the upper corner of the inner sidewall 24 but much stronger at the upper corner of the outer sidewall 22. The inclusion of the non-magnetic spacer 230 between the two tubular magnets 226, 228 of the inner sidewall magnet assembly 224 produces a magnetic field distribution that is more parallel to the inner vault sidewall 24, thereby evening the erosion pattern there. In contrast, as illustrated on the left side, in portions of the vault 18 distant from the roof magnet assembly 236, the magnetic field B' has a reduced intensity, particularly near the vault roof 25. As a result, there is relatively more sputtering of the vault roof 25 in areas of the roof magnet assembly 236 than elsewhere, and the metal ionization fraction in that portion is substantially higher. In contrast, distant from the roof magnet assembly 236, there is relatively substantial sputtering of the vault sidewalls 22, 24 with an increased fraction of neutral metal atoms being produced.

It is known that low-pressure sputtering requires a relatively high magnetic field. It is thus possible to select chamber pressure and target power such that the plasma is supported only adjacent the roof magnet assembly 236 or to select another combination of chamber pressure and target power such that the plasma is supported throughout the vault 18.

It is thus seen that the complex geometry of the magnetron and target of the various embodiments of the invention provides additional controls on the intensity, directionality, and uniformity of sputtering.

It is possible to include multiple concentric vaults and to associate magnetic means with each of them.

It is also possible to additionally include an RF inductive coil to increase the plasma density in the processing space between the target and wafer. However, the unique configurations of the target and magnetron of the invention in large part eliminate the need for expensive coils.

Although the described embodiments have included a magnetron with a vault having vertical sidewalls and producing a substantially horizontal magnetic field in the vault. However, it is appreciated that the magnetic field cannot be completely controlled, and inclinations of the magnetic field may extend up to about 25°. Furthermore, the sidewalls may form more of a V-shaped vault with sidewall slope angles of up to 25°, but a maximum of 10° is preferred.

Although the invention has been described with respect to sputtering a coating substantially consisting of the material of the target, it can be advantageously used as well for reactor sputtering in which a gas such as nitrogen or oxygen is supplied into the chamber and reacts with the target material on the wafer surface to form a nitride or an oxide.

Processes and Structures

The magnetron 180 of FIG. 12 using stationary annular side magnets has been used in a number of experiments with sputtering copper and has shown unusual capabilities. We believe that the unusual results arise from the enhanced ionization fraction of the sputtered copper as it passes through the extended magnetic field in the vault and the restriction of the high-density plasma to only a portion of the vault. The copper ions can be attracted to the wafer by the inherent DC self-bias of a floating pedestal and the attraction can be increased by RF biasing the pedestal. The controlled attraction controls the energy and directionality of the copper ions incident on the wafer and deep into the via hole and allows controlled fractions of ionized and neutral sputtered atoms.

Figure 17:
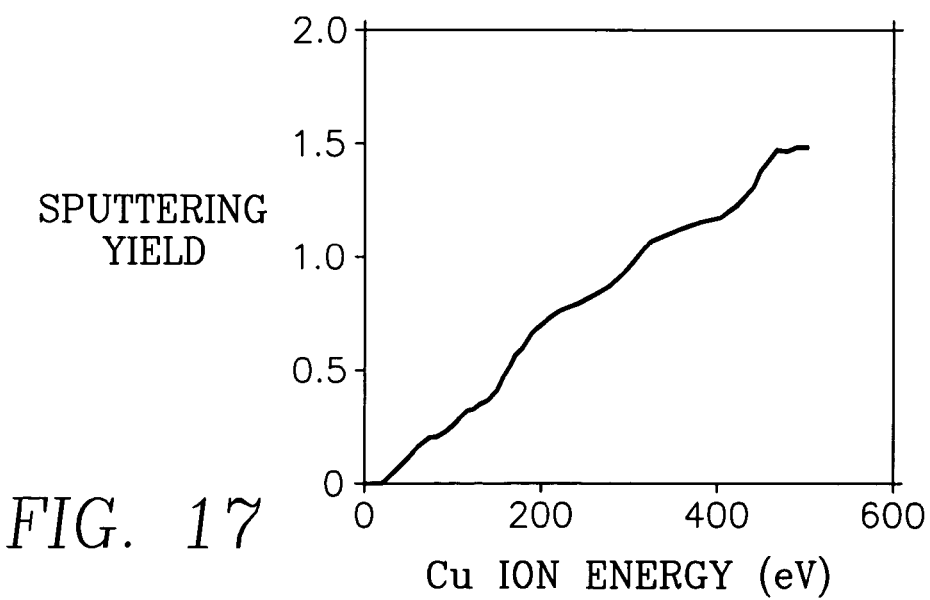
FIG. 17 is a graph of sputtering yield as a function of copper ion energy.
Figure 18:
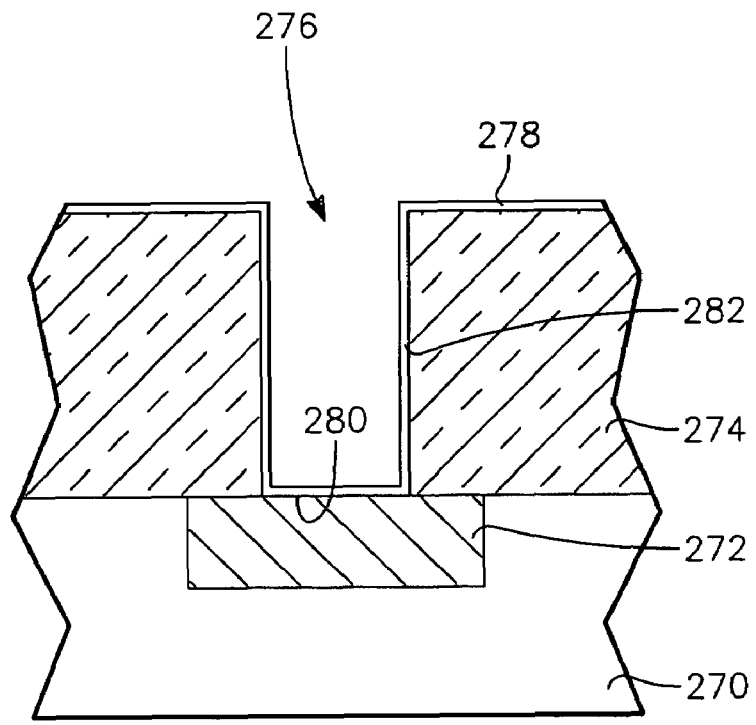
FIGS. 18 and 19 are cross-sectional views illustrating the effects of high-energy ionized sputter deposition, particularly the effect of a high-energy copper PVD deposition removing the barrier layer at the bottom of the via.
Figure 19:
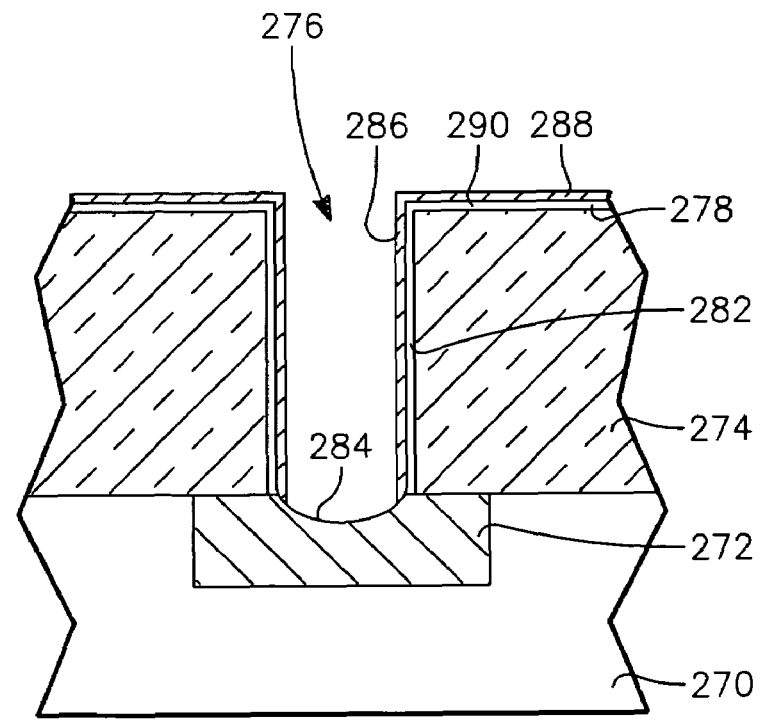

The sputtering yield for copper ions as a function of the ion energy is plotted in FIG. 17. Thus, the higher sputter particles energies possible with the inventive magnetron and other magnetrons can produce a high copper yield in the case that the underlying copper is exposed during sputter processing by high-energy copper ions. Furthermore, the ratio of sputtering yield of tantalum relative to copper is 1:4 and further lower for TaN, thereby providing selectivity over copper. The believed effect of high-energy sputtered copper is schematically illustrated in the cross-sectional view of FIG. 18. A substrate 270 is formed with a lower copper metal feature 272. An inter-level dielectric layer 274 is deposited thereover and photolithographically etched to form a via hole 276. After pre-cleaning, a thin barrier layer 278 is substantially conformally coated in the via 276 hole and over the top of the dielectric 274. The subsequent high-energy copper ion sputter deposition and resultant resputtering of the copper already deposited on the wafer reduces the deposition on the field area on the planar top of the oxide 274 and at a bottom 280 of the via hole 276. However, the copper atoms resputtered from the bottom 280 of the via hole 276 is of lower energy than the incident copper ions and are emitted generally isotropically. As a result, they tend to coat the via sidewalls 282 even more than the via bottom 280 because the sidewalls 282 are not exposed to the anisotropic high-energy copper ion column. The bottom sputtering further is likely to etch through the barrier layer 278 at the via bottom 280, thus exposing the underlying copper 272. Furthermore, the top layer of the copper 272 is cleaned in what is generally a PVD process. As a result, as illustrated in FIG. 19, the barrier layer 278 is removed at the bottom of the via hole 276 and a recess 284, experimentally observed to be concave, is formed in the underlying copper 272. Further, relatively thick copper sidewalls 286 of thickness $d_s$ are deposited while a copper field layer 288 of thickness $d_B$ is formed over the planar top of the dielectric 274. Because of the high resputtering, overhangs do not form on the lip of the via 276. The sidewall coverage $d_s/d_B$ is observed to be in the neighborhood of 50 to 60% for high target power and low chamber pressure. The result may be described as selective PVD.

The removal of the lower barrier layer has two implications. The contact resistance is reduced because the barrier material is removed in the direct current path, specifically at the interface of the via metal being deposited with the underlying metal feature, and the copper of the upper-level metallization is in direct contact with the copper of the lower-level metallization, namely, the copper feature 272. Furthermore, in prior systems, a high resistivity oxide of the underlying metal needed to be removed by a pre-metallization cleaning step. With the invention, the pre-clean that was necessary for that function to clean the oxide or residue at the top of the underlying copper 272 prior to depositing the barrier or seed layer is no longer required to assure direct contact between the two copper levels because the PVD step is itself removing the barrier and cleaning the underlying copper or other metal layer. Pre-cleaning on the sidewalls and top of the dielectric is much less of a requirement and may in some circumstances be eliminated.

It is noted that the structure illustrated in FIG. 19 shows the removal of the barrier layer 278 on the horizontal bottom of the via hole 276 but its barrier field portion 290 remaining in the field area on the planar top of the dielectric layer 274. This is possible if the metal ionization fraction is less than 100% so that a substantial number of unaccelerated metal neutrals are sputtered onto the field area. The neutrals, however, are shielded from reaching the via bottom. As a result, the high-energy metal ions can sputter the barrier layer 278 at the bottom of the via hole 276, but they are overcome by the lower-energy metal neutrals at the top, and there is a net deposition of copper and no barrier removal in the field area on top of the dielectric layer 274. This result differs from the process disclosed by Geffken et al. in the above patent in which all horizontally extending barrier layers are removed.

The sidewall coverage afforded by the high-energy ionized sputter deposition is sufficient for use as a seed layer. It is believed that about 5 nm sidewall coverage is required in 3 $\mu$m-deep vias having an 11:1 aspect ratio. However, the copper field coverage is reduced over the conventional sputtering process and does not provide a sufficient electrical path for the electroplating current. Therefore, a short, more conventional copper sputter process may be used to complete the copper seed layer and eliminate any voids in it and to thicken the field coverage. The more conventional sputtering produces not only lower-energy copper ions but a larger fraction of neutral copper sputter particles, which do not respond to wafer biasing. The two steps can be balanced to provide a balance between bottom coverage, sidewall coverage, and blanket thickness. That is, the conformality can be tailored. The more conventional copper sputter could be performed in a separate sputter reactor. However, in view of the small quantity of copper needed to complete the seed layer, the same reactor used for the high-energy sputtering can be adjusted to effect lower-energy sputtering. To accomplish this second step, for example, the target power can be reduced to reduce the plasma density and metal ionization fraction, the chamber pressure can be raised above 1 milli-Torr, preferably about 1.5 milliTorr or higher, to reduce the wafer self-bias, thus reducing the ion energy, and to decrease the metal ionization fraction, the RF pedestal bias power can be reduced to decrease the acceleration of ions toward the wafer, or a combination of the three changes can be made between the two steps.

Figure 20:
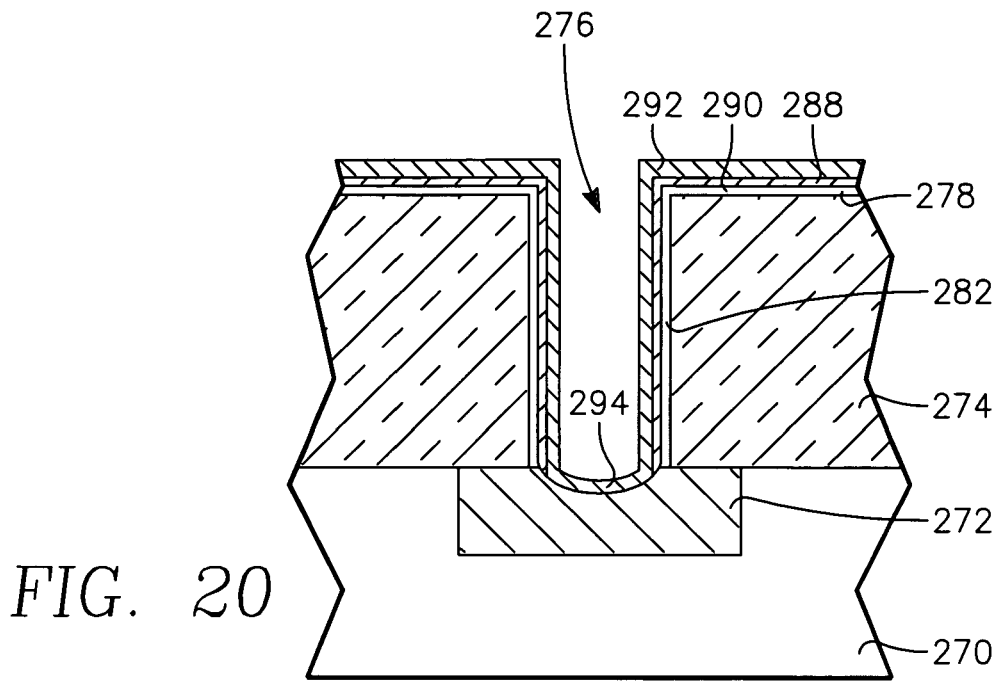
FIG. 20 is a cross-sectional view illustrating how one copper PVD reactor can be used to both remove the barrier at the via bottom and to deposit a copper layer in its place.

The structure of FIG. 19 is accomplished by producing a relatively high but not very high copper ionization fraction. It is possible to perform within a single sputter reactor a two-step copper PVD process in which the first step produces the structure of FIG. 19 and the second step is performed with chamber parameters adjusted to reduce the copper ion energy so that, as illustrated in the cross-sectional view of FIG. 20, the via bottom is coated with a second copper layer 292 covering all areas including a via bottom portion 294. Further, it is noted that the two-step copper PVD process can be advantageously used even in the case where the first step does not leave a barrier field layer 290 and a first copper field layer 288 is not deposited. For single-level damascene, the field region is subjected to CMP, and these extra layers in the field region are not crucial.

Following the formation of the second copper layer 292, the via hole is filled and overfilled by electro chemical plating of copper using the second copper layer 292 both as a seed layer and an electrode. Thereafter, the copper and typically the barrier layers exposed over the field area are removed by chemical mechanical polishing.

Although the description above is directed to removing the barrier layer at the bottom of the via hole, a similar two-step process may be used to produce a more conformal seed layer coating even if the bottom barrier layer is not removed. The chamber parameters for the first step are adjusted to emphasize middle sidewall coverage with little or no bottom and/or field coverage. The chamber parameters are then changed for the second step to emphasize bottom, upper sidewall, and field coverage. In most cases, this means that there is a substantial fraction of energetic metal ions in the first step and a larger fraction of neutrals relative to energetic ions in the second step. The two-step process is superior to a one-step process with intermediate chamber parameters because the latter tend to immediately begin producing an overhanging lip at the top of the via hole which would interfere with bottom and middle sidewall coverage.

Figure 21:
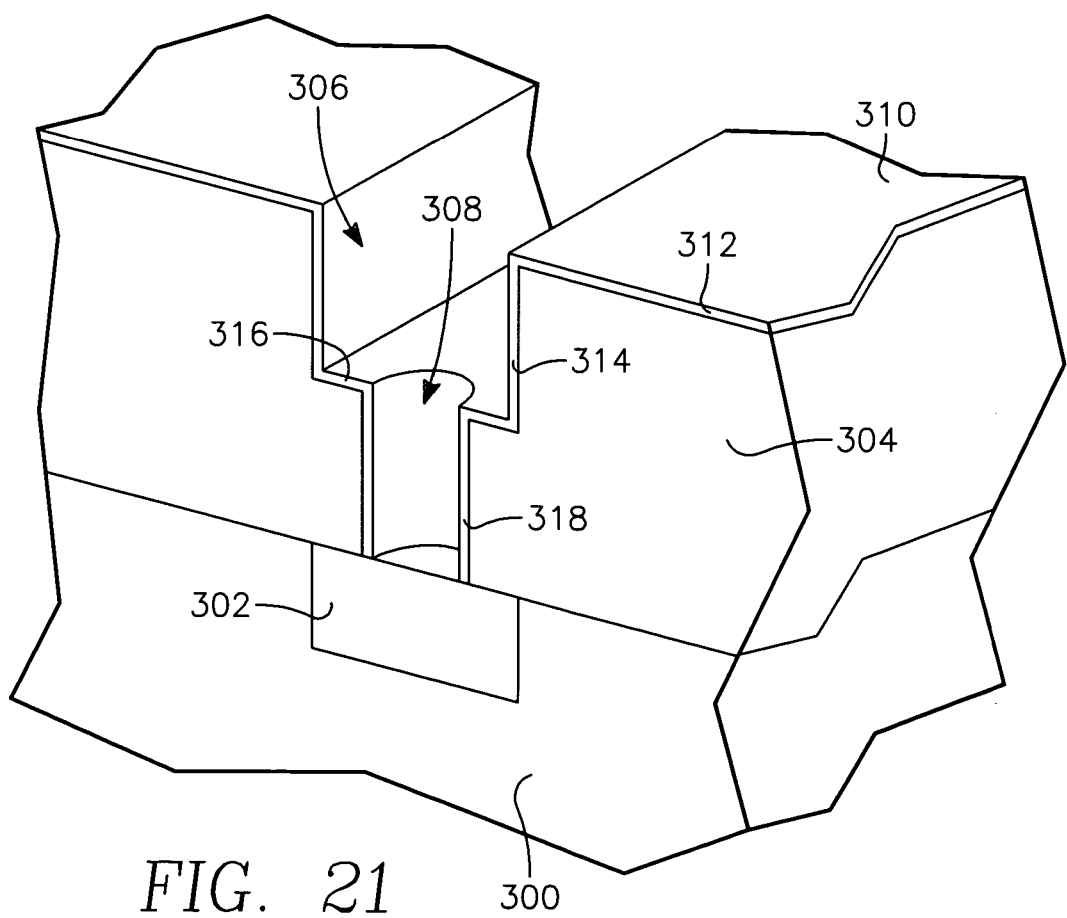
FIG. 21 is a sectioned orthographic view of a desired barrier layer in a dual-damascene interconnect.

The invention can be advantageously applied to more complex and demanding structures desired in advanced integrated circuits. A dual damascene structure is illustrated in the sectioned orthographic view of FIG. 21, which allows inter-level vias and horizontal interconnects to be metallized in a single metallization process. A generally dielectric underlayer 300 includes a copper feature 302 in its surface that needs to be electrically contacted through an overlying inter-level dielectric layer 304. A horizontally extending trench 306 is formed at the top of inter-level dielectric layer 304, and one or more vias 308 (only one of which is illustrated) are formed between the bottom of the trench 306 and the corresponding ones of the copper features 302. A single sequence of metallization steps are used to simultaneously metallize the trench 306 (providing the horizontal interconnects) and the vias 308 to the lower-level metallization 302. However, a barrier layer 310 is required between the metal and any neighboring dielectric materials, for example, a TaN barrier for copper metallization. The barrier layer 310 is divided into a field portion 312 on top of the upper dielectric layer 304, a trench sidewall portion 314, a trench floor portion 316, and a via sidewall portion 318. All these portions 312, 314, 316, and 318 are desired for a reliable integrated circuit. However, it is desired that the barrier layer 310 not extend over the bottom of the via hole 308 in order to reduce the contact resistance to the metal feature. Accordingly, it is greatly desired that a sputtering process be available which has high bottom coverage in the trench 306 and no bottom coverage in the via hole 308. The dual-damascene process disclosed by Geffken et al. in the above cited patent lacks this selectivity. It is noted that the trench 306 has a very low aspect ratio along its axis but may have a relatively high aspect ratio transverse to its axis. Chen et al. describe a somewhat similar selective removal and deposition in Ser. No. 09/704,161, filed Nov. 1, 2000, incorporated herein by reference in its entirety. Parent U.S. Pat. No. 6,277,249 discloses a similar process to that discussed here with respect to FIGS. 14 and 15.

Figure 22:
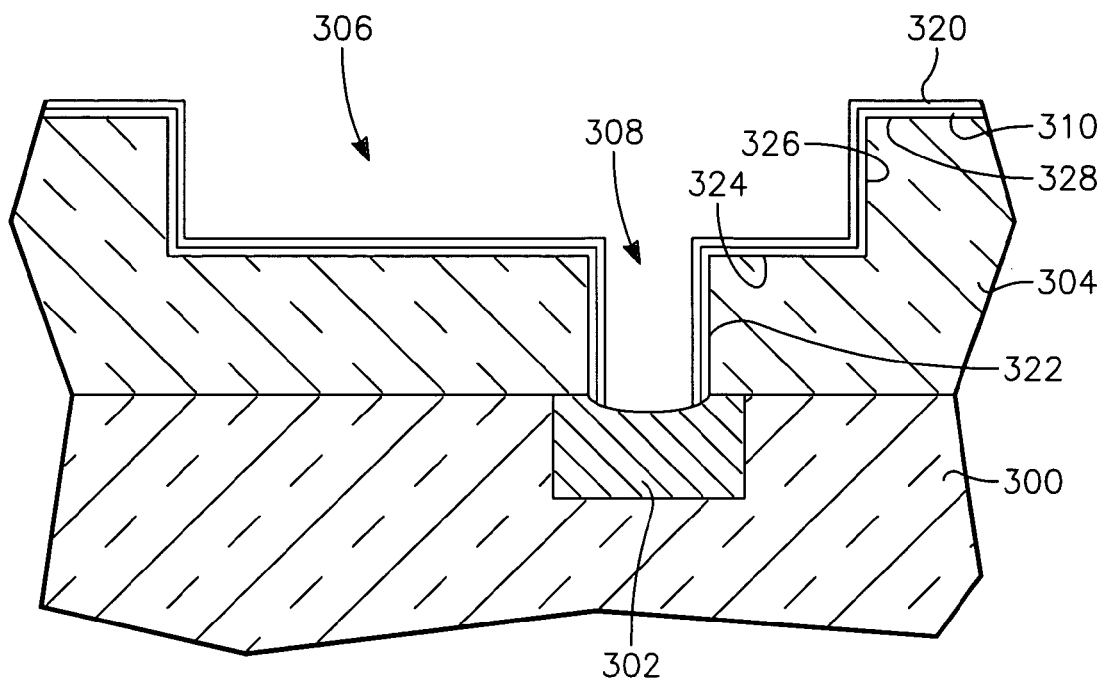
FIGS. 22 and 23 are cross-sectional views of a desirable structure for a barrier layer and copper seed layer in a dual-damascene interconnect.

Such a selective removal of the barrier layer and selective deposition of copper is possible by adjusting the copper PVD process parameters to assure a balance between energetic copper ions and low-energy copper neutrals to produce the structure illustrated in cross section in FIG. 22. A first copper seed layer 320 is deposited with relatively high copper ion energy but a substantial neutral fraction so that the barrier layer 310 at the bottom of the via hole 308 is removed and the underlying copper feature 302 is cleaned. However, the copper layer 320 is deposited over and thus protects the barrier layer 310 on the via sidewall 322, the trench floor 324, the trench sidewall 326, and the field area 328 because these are either less exposed to the high-energy copper ions or more exposed to the lower-energy copper neutrals.

Figure 23:
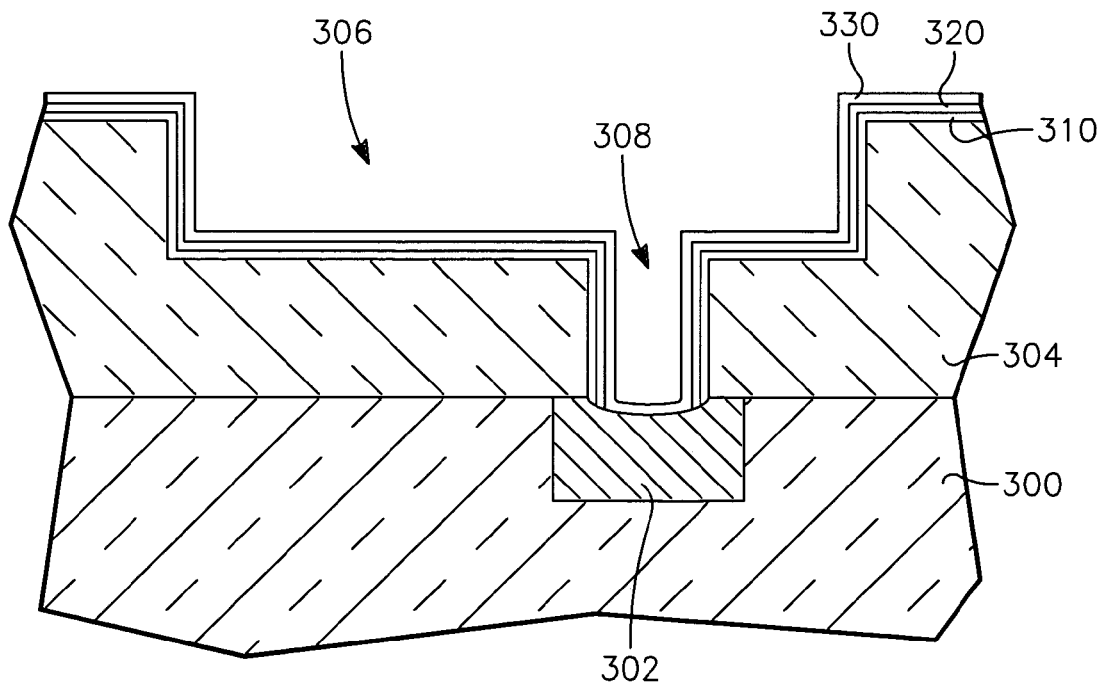

It is advantageous to perform the second copper seed deposition to produce a conformal second copper seed layer 330, illustrated in the cross-sectional view of FIG. 23, to assure a thick sidewall and via bottom coverage as well as thick field coverage. The second copper seed layer 330 is in direct contact with the cleaned upper surface of the underlying copper feature 302, thus assuring a good electrical contact.

Following the deposition of the second copper seed layer 330, the via hole 308 and trench 306 are filled with copper by electrochemical plating using the second copper layer 330 as both a seed layer and a plating electrode. Thereafter, chemical mechanical polishing removes any copper exposed above the field area 328 outside of the trench 306 and typically also the barrier layer 310 in the area.

For a given PVD chamber, particularly one of the SIP+ chamber described above, the metal ionization fraction is increased by operating at a lower pressure or a higher target power. The metal ion energy can be increased by these same two techniques or by increasing the pedestal self-bias by any technique.

It has been observed that the DC self-bias on a floating pedestal depends on the chamber pressure. For example, at 0.85 milliTorr, a self bias of about −20VDC develops; and at 0.64 milliTorr, about −100VDC. Thus, the chamber pressure can be used to control the copper ion energy. Similarly, increases of the target power from 20 kW to 40 kW show about the same sequence of floating self-bias voltages, providing yet another tool for copper ion energy.

An alternative approach to differentiate between the bottom and top of the via hole is to use an auxiliary electromagnetic coil wrapped around the outside of the central axial portion of the chamber about its central axis to selectively generate an axial magnetic field between the target and wafer. When the field is turned on in the first step, the metal ions are preferentially guided toward the wafer compared to when the field is turned off or reduced in the second step. Wei discloses such an auxiliary electromagnet in U.S. patent application Ser. No. 09/612,861, filed Jul. 10, 2000, now issued as U.S. Pat. No. 6,352,629, incorporated herein by reference in its entirety.

We believe that a sputter reactor such as those of FIGS. 11, 13, and 14 having vaulted target and one or more nested top magnet assemblies and continuous inner and outer sidewall magnet can be operated in two distinct modes determined by a combination of target power and chamber pressure. At higher power and lower pressure, the self-bias on the pedestal is between −100 to −150VDC while at lower power and higher pressure, the self-bias assumes the more normal value of −30VDC. A related difference is that, below a certain argon pressure, the target voltage is between about −450 and −700VDC while above that pressure the target voltage drops to about −400VDC. Although we are not bound by our understanding of the invention, we believe that at lower pressure and higher power the plasma is maintained in the vault only in the area of the top nested magnet assembly. Elsewhere, the plasma is extinguished. The magnetic fields in the area of the localized plasma may be sufficient to funnel an ionized copper flux towards the wafer. The copper ionization fraction in this mode may be quite high, near 50%, and the high wafer self-bias draws highly energetic ions to the wafer and deep within high aspect-ratio holes. We believe that at higher pressure the sidewall magnets are sufficient to maintain a plasma throughout the entire length of the vault. The lower plasma densities and increased scattering produce a more neutral flux of copper atoms.

Applying RF bias to the pedestal through a coupling capacitor will also increase the DC self-bias.

Some of the more pronounced high-energy sputtering results were obtained with a chamber pressure of 0.5 milliTorr, 40 kW of target power, and 300 W of RF bias applied to the pedestal.

Figure 24:
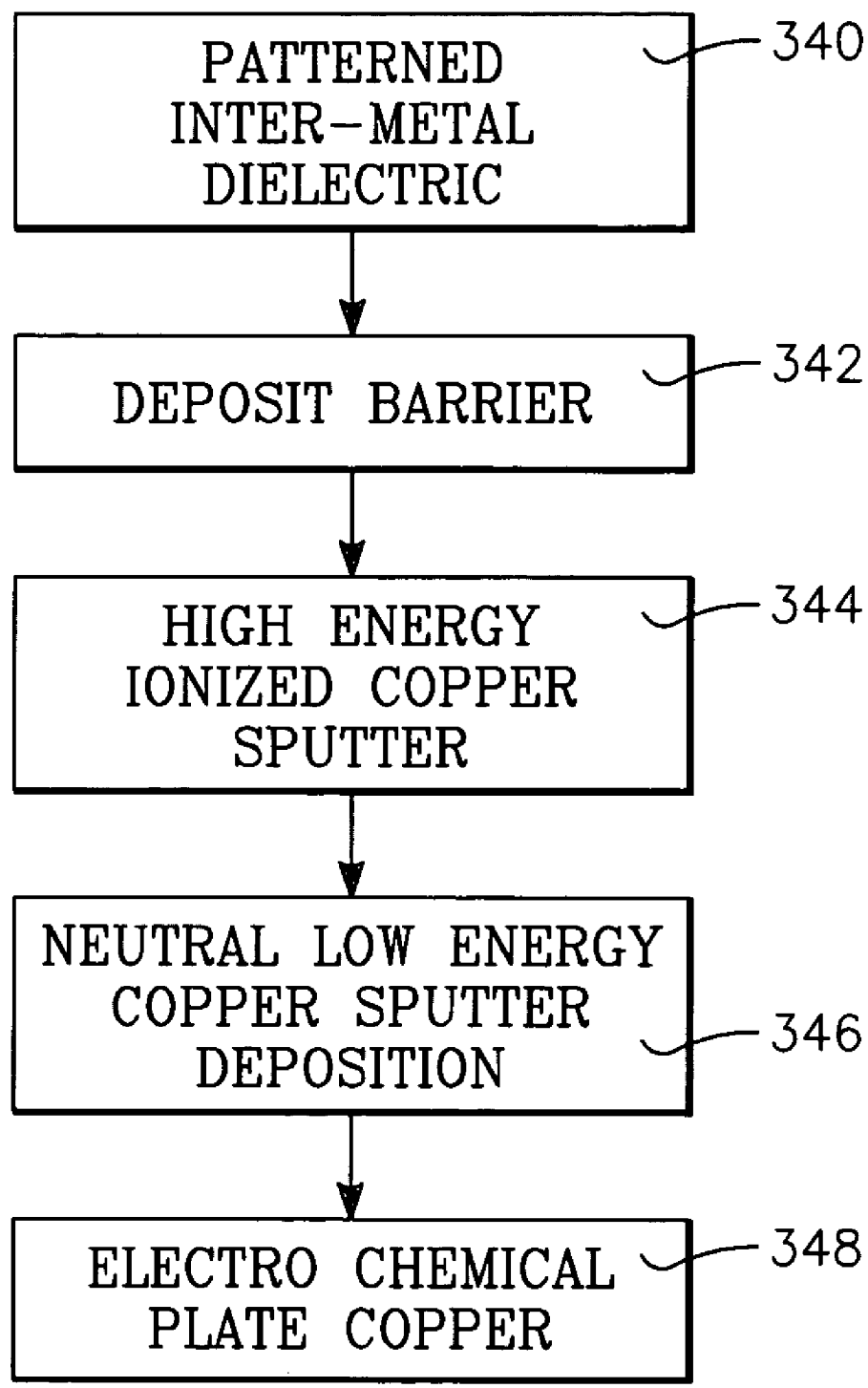
FIG. 24 is a flow diagram of a process usable for achieving the desired interconnects of FIGS. 20 and 23 including a electroplating via fill.

A process for accomplishing a copper via is illustrated in the flow diagram of FIG. 24. In step 340, a inter-metal dielectric layer of, for example, TEOS silicon dioxide or a low-k dielectric whether carbon-based or silicon-based, is deposited, usually by a CVD process and photolithographically patterned with via holes using a plasma etching process. The dielectric patterning may be dual damascene, which includes both the vias and interconnect trenches in a common connecting structure. These steps are not directly part of the invention, and may be practiced in any number of ways. It is assumed that the material underlying the via holes is copper. Contact holes to underlying silicon require a somewhat more complex process.

Thereafter, the wafer is placed in a multi-chamber integrated processing system. In some circumstances, no plasma preclean need be performed. Instead, one PVD system is used in step 342 to deposit the barrier layer into the via hole and on top of the dielectric. Chemical vapor deposition (CVD) can instead be used for the barrier layer, or a combination of CVD and PVD can be used. In step 344, the high-energy ionized copper deposition both cleans the bottom of the via hole and coats its sidewalls, as has been described. This step also cleans the interface of the underlying copper exposed beneath the barrier layer. Even in this mode, a substantial neutral flux is present that cannot penetrate to the bottom of the via hole but does deposit on the planar field portion above the dielectric. As a result, the barrier layer on the field portion is not sputtered away by the energetic copper ions but is protected by some deposition of neutral copper.

In step 346, a lower-energy, more neutral copper sputter deposition is performed to complete the seed layer, also used as the electroplating electrode. Whatever copper ions are present are accelerated by a lesser self-bias voltage and thus do not significantly sputter. Therefore, the lower energy copper ions the bottom of the via to provide bottom coverage and the neutral copper effectively coats the exposed planar field portion.

The two steps 344, 346 can be at least partially separated by requiring the first step 344 to be performed at a pressure of less than 1.0 milliTorr, more preferably 0.7 milliTorr or less, and most preferably 0.5 milliTorr or less, while the second step 346 is performed at 1.5 milliTorr or above.

By proper timing of the two steps 344, 346 and their associated target powers and chamber pressure, not only is the bottom barrier layer removed but the conformality of the copper deposition at the via bottom, via sidewall, and field portion can be adjusted.

In step 348, the copper metallization is completed with an electroplating or other electrochemical process.

Although this process has been described with reference to the inventive vault magnetron, similar high-energy ionized copper sputtering can be achieved in other ways. Achieving the desired selective PVD is believed to be eased by creating an energy distribution of the copper ions in the plasma with a peak energy of between 50 and 300 eV and/or by maintaining the ratio of argon ions to copper ions $Ar^+/Cu^+$ in the plasma at 0.2 or less. Of course, the ultimate low fraction is obtained with sustained self-sputtering. The low fraction of argon ions reduces the problems commonly experienced with HDP sputtering.

Further, it has been shown the inventive SIP$^+$ reactors can be used for the sputter deposition of Ta, TaN, Al, Ti, and TiN and should be usable with W, especially for the effects of selective removal, selective deposition, and a multi-step process.

The inventive process need not completely remove the barrier layer at the bottom of the via to reduce the contact resistance. The outer portion, for example, of TiN while providing the barrier function has the highest resistivity. Hence, removing just the nitride portion would be advantageous.

Of course, the invention can be used with copper alloyed with a five percent of an alloying element such as silicon, aluminum, or magnesium. Further, many aspects of the invention are applicable as well to sputtering other materials.

What is claimed is:

1. A sputtering method performed in a plasma sputter reactor having a target comprising a metal and powered by a selective DC power supply and a pedestal electrode powered by a selective RF power supply and configured to support in opposition to said target a substrate having a hole formed and coated with a layer of a material, comprising the steps of:
   a first step of selecting a first DC power level applied by said DC power supply to said target and a first RF power level applied by said RF power supply to said pedestal electrode to effect etching of said layer in a first portion of said hole and deposition of said metal on a second portion of said hole; and
   a first step of applying said first DC power level to said target and said first RF power level to said pedestal electrode to simultaneously perform said etching and said deposition on said substrate.

2. The method of claim 1, wherein said first portion includes a bottom of said hole and said second portion includes a sidewall of said hole.

3. The method of claim 1, further comprising the steps of:
   a second step of selecting a second DC power level applied by said power supply to said target and a second RF power level applied by said RF power supply to said pedestal electrode to effect deposition of said metal on said first and second portions of said hole; and
   a second step of applying said second DC power level to said target and said second RF power level to said pedestal electrode to deposit said metal on said first and second portions of said substrate.

4. The method of claim 3, wherein said second applying step is performed after said first applying step.

5. The method of claim 3, wherein said first and second RF power levels are finite power levels.

6. The method of claim 3, wherein said hole is a dual damascene hole.

7. The method of claim 3, wherein said metal comprises copper.

8. The method of claim 3, wherein said metal is selected from the group consisting of titanium, tantalum, and tungsten.

9. The method of claim 8, wherein said metal comprises tantalum.

10. The method of claim 8, further comprising supplying nitrogen into said sputter reactor during at least one of said first and second applying steps.

11. The method of claim 1, wherein said hole is a dual damascene hole.

12. The method of claim 1, wherein said metal is selected from the group consisting of titanium, tantalum, and tungsten.

13. The method of claim 12, wherein said metal comprises tantalum.

14. The method of claim 1, wherein said first applying step is continued for a time sufficient to etch through said layer in said first portion of said hole.

15. The method of claim 1, wherein said target has a complex shape including a vault facing said pedestal electrode.

16. The method of claim 15, wherein said vault is an annular vault with two cylindrical sidewalls facing each other.

17. The method of claim 1, wherein said second portion includes a generally planar field portion on a top of said substrate outside of said hole.

18. The method of claim 1, wherein said metal comprises copper.

19. A sputtering method performed in a plasma reactor having a target comprising a metal and powered by a selective DC power supply and a pedestal electrode powered by a selective RF power supply and configured to support in opposition to said target a substrate having a hole formed therein which is coated by a layer of a barrier material, comprising the steps of:
   selecting a first DC power level applied by said DC power supply to said target and a first RF power level applied by said RF power supply to said pedestal electrode to effect etching of said barrier material in a first portion of said hole and deposition of said metal on a second portion of said hole; and
   applying said first DC power level to said target and said first RF power level to said pedestal electrode to simultaneously perform said etching and said deposition on said substrate, wherein said applying step is continued only to the extent to not completely remove the barrier layer in said first portion.

20. The method of claim 19, wherein said first portion includes a bottom of said hole.

21. The method of claim 20, wherein said hole is a dual damascene hole having a trench and a via and said bottom is a bottom of said via.

22. The method of claim 21, wherein said second portion includes a floor portion of said trench.

23. The method of claim 20, wherein said second portion includes a generally planar field portion on top of said substrate outside of said hole.

24. The method of claim 19, wherein said metal comprises copper.

* * * * *